United States Patent
Merkel et al.

(10) Patent No.: US 7,265,712 B2
(45) Date of Patent: Sep. 4, 2007

(54) METHOD AND APPARATUS FOR PROCESSING HIGH TIME-BANDWIDTH SIGNALS USING A MATERIAL WITH INHOMOGENEOUSLY BROADENED ABSORPTION SPECTRUM

(75) Inventors: Kristian Merkel, Bozeman, MT (US); Zachary Cole, Bozeman, MT (US); Krishna Rupavatharam, Bozeman, MT (US); William R. Babbitt, Bozeman, MT (US); Kelvin Wagner, Boulder, CO (US); Tiejun Chang, Bozeman, MT (US)

(73) Assignee: Montana State University, Bozeman, MT (US)

(*) Notice: Subject to any disclaimer, the term of this patent is extended or adjusted under 35 U.S.C. 154(b) by 328 days.

(21) Appl. No.: 10/515,089

(22) PCT Filed: May 12, 2003

(86) PCT No.: PCT/US03/14612

§ 371 (c)(1),
(2), (4) Date: Nov. 12, 2004

(87) PCT Pub. No.: WO03/098384

PCT Pub. Date: Nov. 27, 2003

(65) Prior Publication Data

US 2006/0049981 A1   Mar. 9, 2006

Related U.S. Application Data

(60) Provisional application No. 60/378,059, filed on May 16, 2002.

(51) Int. Cl.
  *G01S 13/00* (2006.01)
(52) U.S. Cl. .................. 342/195; 342/200; 359/240

(58) Field of Classification Search ............. 342/195, 342/196, 202, 200
See application file for complete search history.

(56) References Cited

U.S. PATENT DOCUMENTS 4,459,682 A   7/1984   Mossberg et al.

(Continued)

FOREIGN PATENT DOCUMENTS

| WO | WO00/38193 | 6/2000 |
| WO | WO01/18818 | 3/2005 |

OTHER PUBLICATIONS

Loring, ROger F., "Statistical Mechanical Calculation of Inhomogeneously Broadened Absorption Line Shapes in Solution," The Journal of Physical Chemistry, vol. 94, No. 2, 1990.*

(Continued)

*Primary Examiner*—Ian J. Lobo
(74) *Attorney, Agent, or Firm*—Evans & Molinelli PLLC; Eugene Molinelli

(57) ABSTRACT

Techniques for analog processing of high time-bandwidth-product (TBP) signals use a material with an inhomogeneously broadened absorption spectrum including multiple homogeneously broadened absorption lines. A first set of signals on optical carriers interact in the material during a time on the order of a phase coherence time of the homogeneously broadened absorption lines to record an analog interaction absorption spectrum. Within a time on the order of a population recovery time for a population of optical absorbers it the material, the interaction absorption spectrum in the material is read to produce a digital readout signal. The readout signal represents a temporal map of the interaction absorption spectrum, and includes frequency components that relate to a processing result of processing the first set of signals. The techniques allow processing of RADAR signals for improved range resolution to a target, as well as speed of the target, among other uses.

51 Claims, 18 Drawing Sheets

U.S. PATENT DOCUMENTS

| | | | |
|---|---|---|---|
| 4,670,854 | A | 6/1987 | Mossberg |
| 5,239,548 | A | 8/1993 | Babbitt |
| 5,276,637 | A | 1/1994 | Mossberg |
| 5,369,665 | A | 11/1994 | Bai |
| 5,381,362 | A | 1/1995 | Shen |
| 5,812,318 | A | 9/1998 | Babbitt |
| 6,680,860 | B1 | 1/2004 | Merkel |

OTHER PUBLICATIONS

Babbitt, W.R. and Bell, J.A., Coherent transient continuous optical processor, 1994, p. 1538, vol. 33, Publisher: Appl. Opt.

Jefferson, C.M. and Meixner, A.J., Frequency-domain measurements of spectral whole patterns burned with phase-coherent pulses., 1992, pp. 60-66, vol. 189, Publisher: Chem. Phys. Lett.

Reibel R. R. PhD Thesis Entitled "High bandwidth optical coherent transient true-time delay" Montana State University (2002).

Xiangjun Wang, Afzelius M, Ohlsson N, Gustafsson U, and Kroll S. Coherent transient data-rate conversion and data transformation, Optics Letters.; 25(13): 945-7; Jul. 1, 2000.

Menager L, Lorgere I, Le-Gouet J. L, Krishna Mohan R, and Kroll S., Time-domain Fresnel-to-Fraunhofer diffraction with photon echoes Optics Letters, 24(14): 927-9, Jul. 15, 1999.

L. Menager, I. Lorgere, J.-L. Le Gouet, D. Dolfi, J.-P. Huignard, Demonstration of a radio-frequency spectrum analyzer based on spectral hole burning, Opt. Lett. 26 (2001) 1245.

I. Lorgere, L. Menager, V. Lavielle, J.-L. Le Gouet, D.Dolfi, S. Tonda, J.-P. Huignard, Demonstration of a radio-frequency spectrum analyser based on spectral hole burning, J. Mod. Opt. 49 (2002) 2459.

H. Lin, T. Wang, G. A. Wilson, T. W. Mossberg, Heterodyne detection of swept-carrier frequency-selective optical memory signals, Opt. Lett., 15 928(1995).

Z. Cole, T. Böttger, R. Krishna Mohan, R. Reibel, W. R. Babbitt, R. L. Cone and K. D. Merkel, Coherent Integration of 0.5GHz Spectral Holograms at 1536nm using dynamic bi-phase codes, Appl. Phys. Lett. 81, 3525 (2002).

Z. Barber, M. Tian, R. Reibel, and W. R. Babbitt, "Optical pulse shaping using optical coherent transients", Opt. Exp. 10, 1145-1150 (2002).

V. Lavielle, I. Lorgere, J. L Le Gouet, S. Tonda, and D. Dolfi, Wideband versatile radio-frequency spectrum analyzer, Opt. Lett., 28, 384 (2003).

K.D. Merkel and W. R. Babbitt, "Optical coherent transient continuously programmed continuous processor," Optics Letters 24, 172 (1999).

K. D. Merkel and W. R. Babbitt, "Chirped-pulse programming of optical coherent transient true-time delays," Optics Letters 23, 528 (1998).

R. Reibel, Z. Barber, M. Tian, W. R. Babbitt, "High Bandwidth Spectral Gratings Programmed with Linear Frequency Chirps", J. Lumin. 98 355 (2002).

R. Reibel, Z. Barber, M. Tian, W. R. Babbitt, Temporally overlapped linear frequency-chirped pulse programming for true-time delay applications, Optics Letters, 27, 494 (2002).

Y. S. Bai, W. R. Babbitt, N. W. Carlson, and T. W. Mossberg, "Real-Time Optical Waveform Convolver/Cross Correlator," Appl. Phys. Lett. 45, 714 (1984).

M. Zhu, W.R. Babbitt, C. M. Jefferson, "Continuous coherent transient optical processing in a solid," Optics Letters 20, 2514-2516 (1995).

K. D. Merkel and W. R. Babbitt, "Optical coherent transient true-time delay regenerator," Optics Letters 21, 1102-1104 (1996).

K.D. Merkel, W.R. Babbitt, K.E. Anderson, and K.H. Wagner, "Variable-time delay optical coherent transient signal processing," Optics Letters, 24, 1386-1388 (1999).

K. D. Merkel, R. D. Peters, P. B. Sellin, K. S. Repasky and W. R. Babbitt, "Accumulated programming of a complex spectral grating," Optics-Letters 25, 1627-1629 (2000).

K.D. Merkel, R. Krishna Mohan, Z. Cole, T. Chang, A. Olson, and W. R. Babbitt, "Multi-Gigahertz radar range processing of baseband and RF carrier modulated signals in Tm:YAG," J. Lum. 107 62-74 (2004).

Shen,-X.-A.; Kachru,-R, "Use of biphase-coded pulses for wideband data storage in time-domain optical memories", Applied-Optics. Jun. 10, 1993; 32(17): 3149-51.

Bai,-Y.-S.; Kachru,-R., "Coherent time-domain data storage with a spread spectrum generated by random biphase shifting" Optics-Letters. Jul. 15, 1993; 18(14): 1189-91.

Merkel, K.D. and Babbitt, W.R., Frequency-tuned continuous true-time delay by optical coherent transient technology, Technical Digest, summaries of papers presented at the conference on lasers and electro-optics. Postconference edition CLEO 1999, Conference on Lasers and Electro-Optics, Baltimore, MD May 23-29, 1999, p. 171.

* cited by examiner

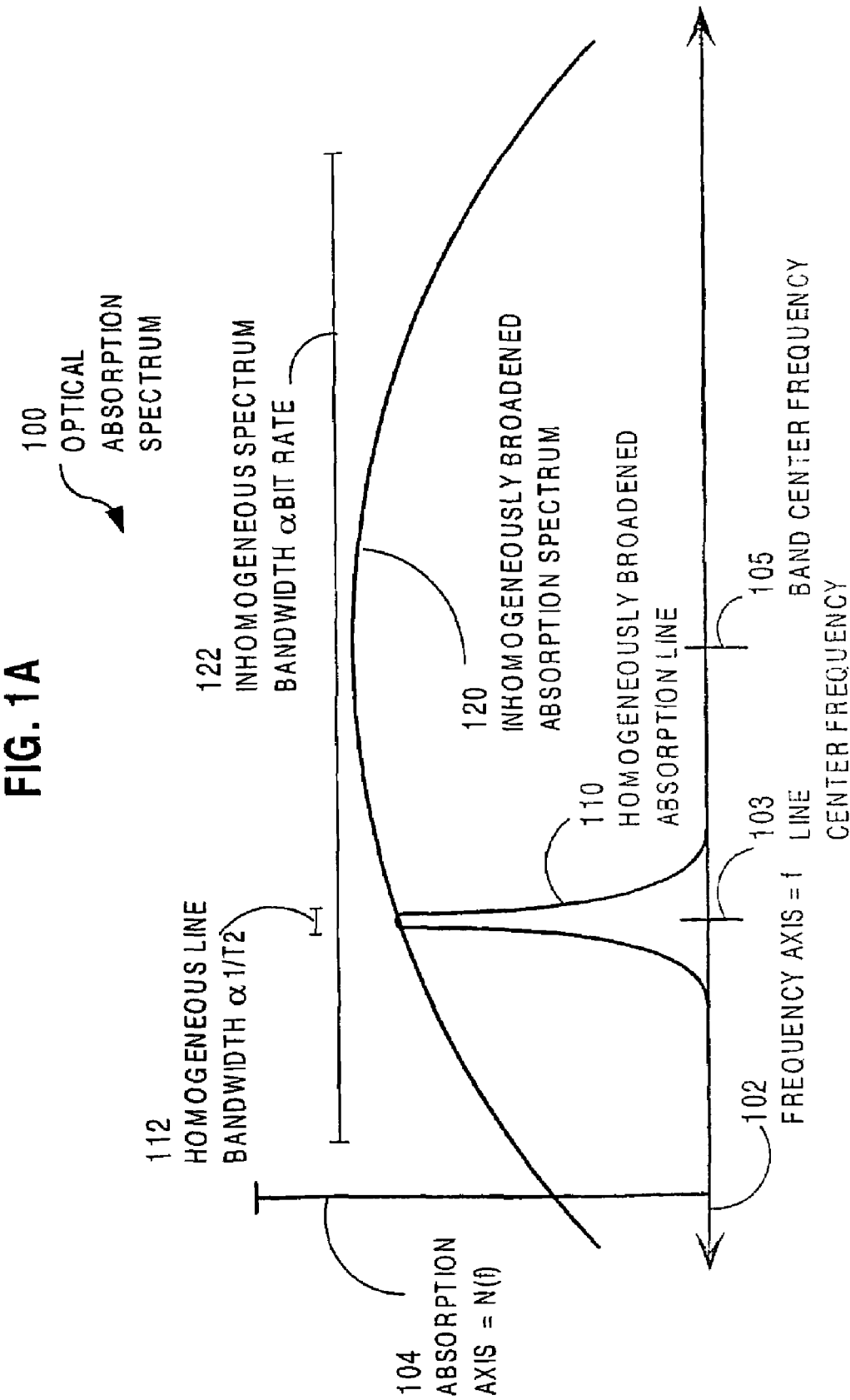

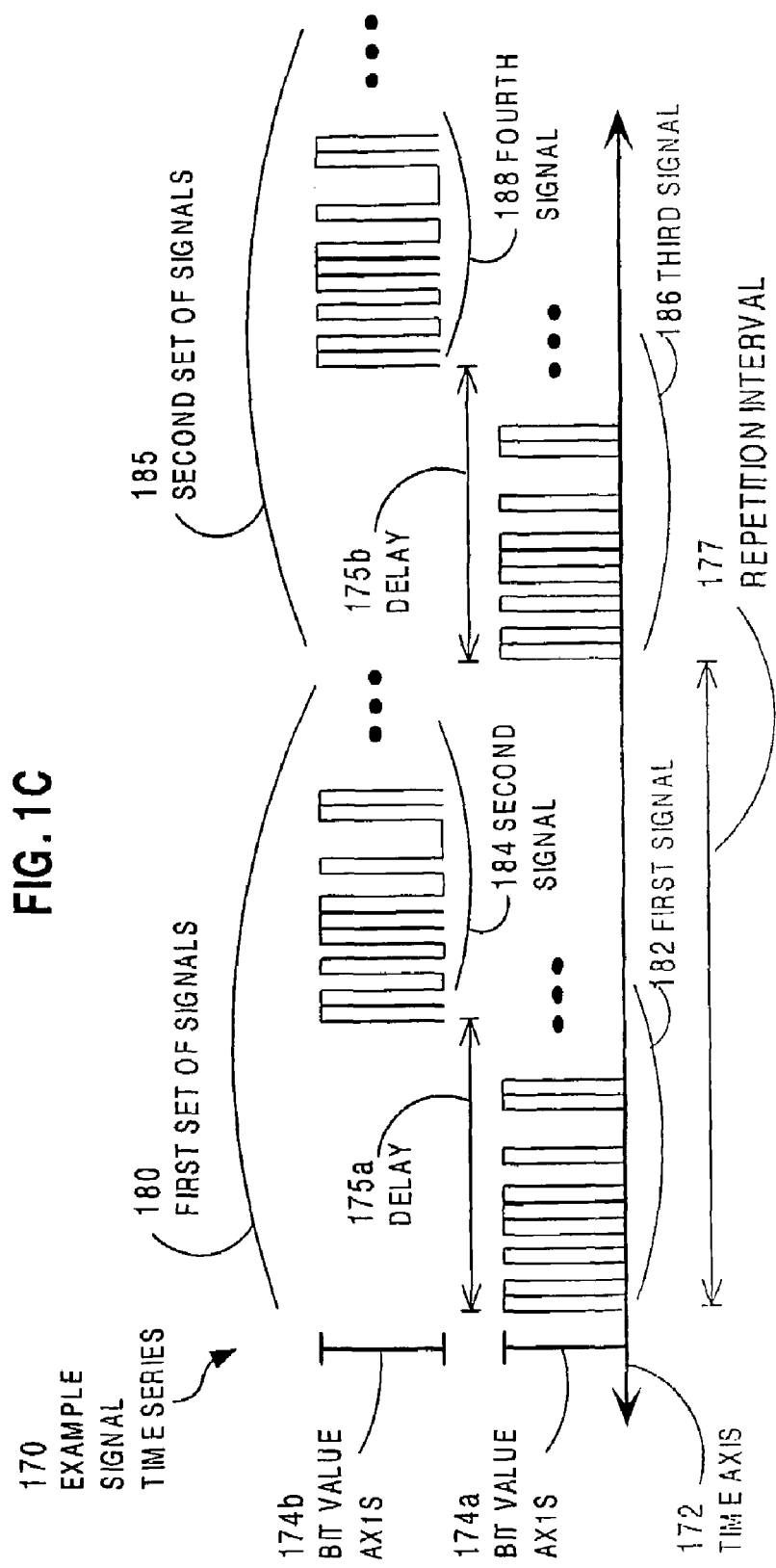

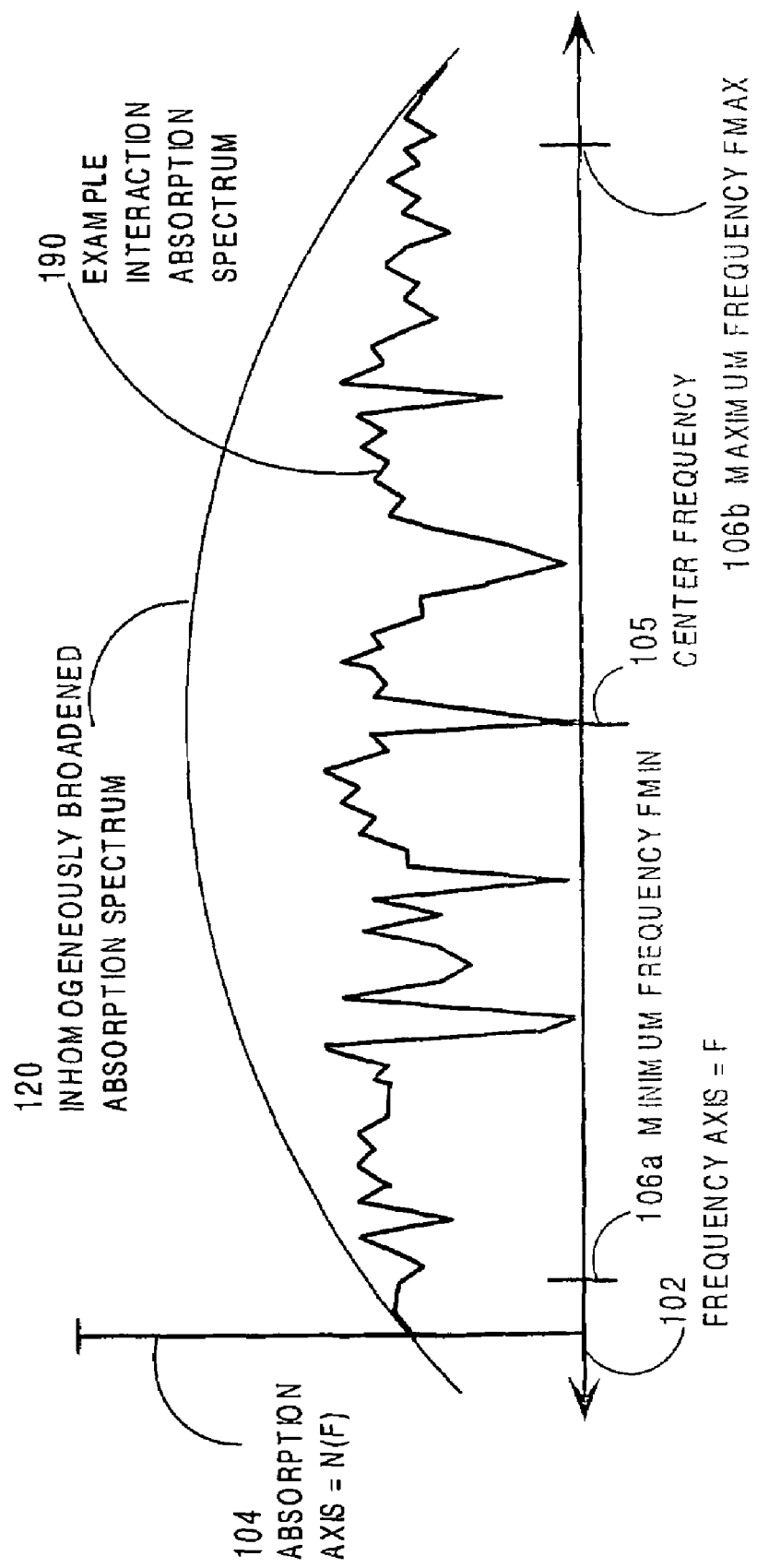

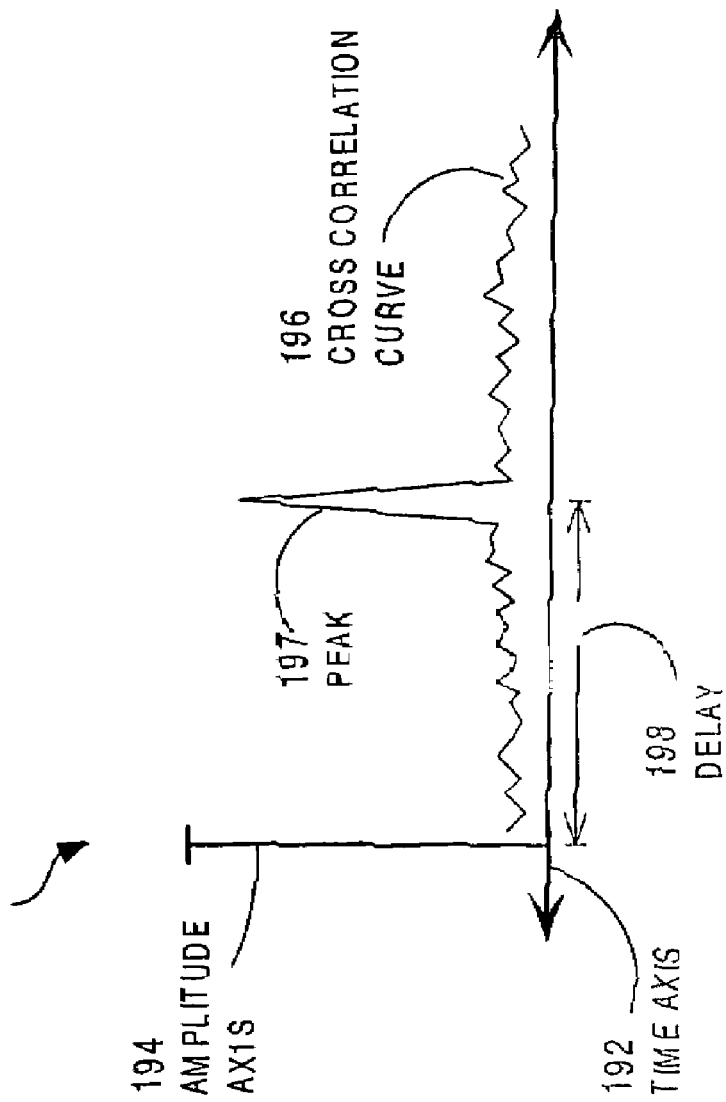

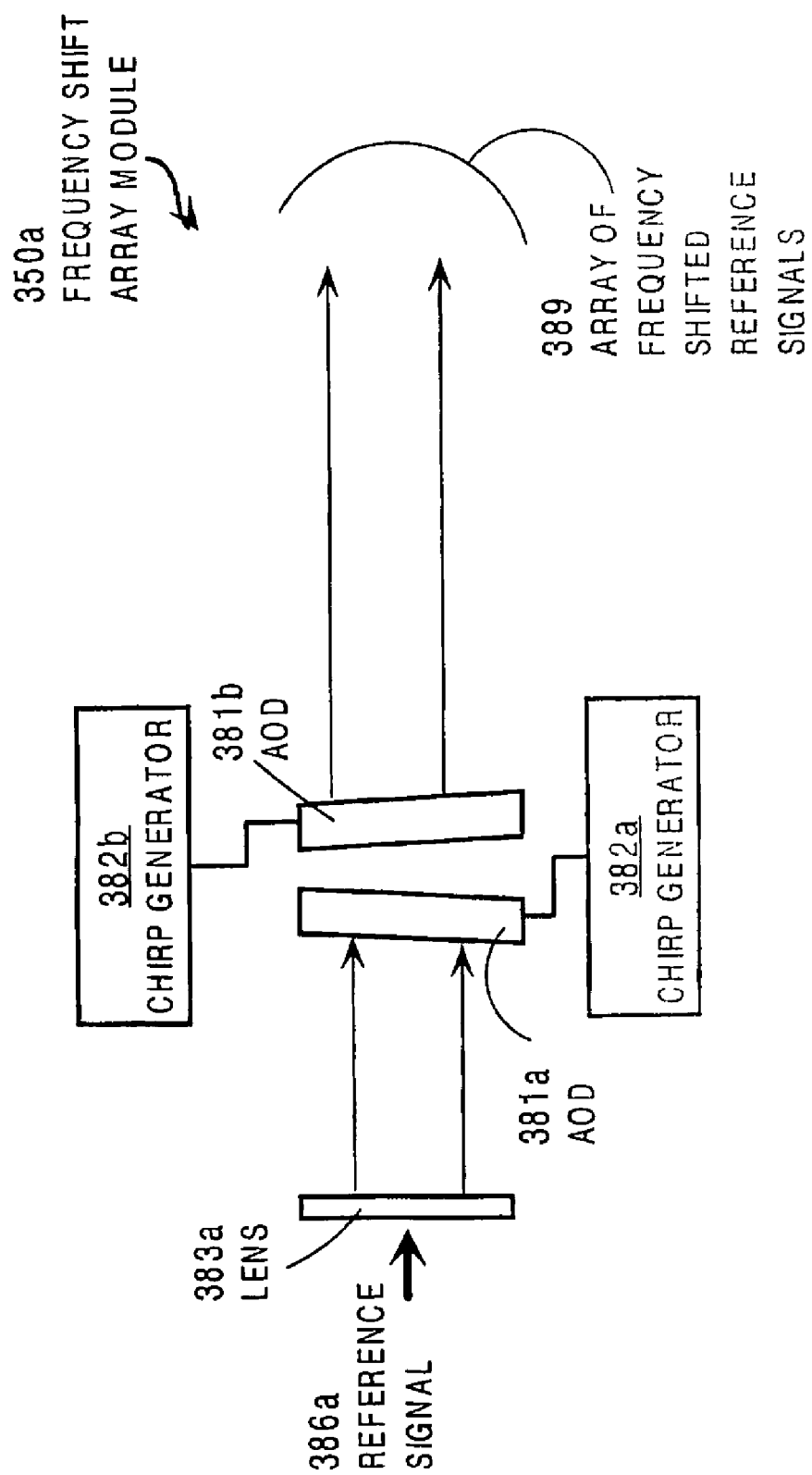

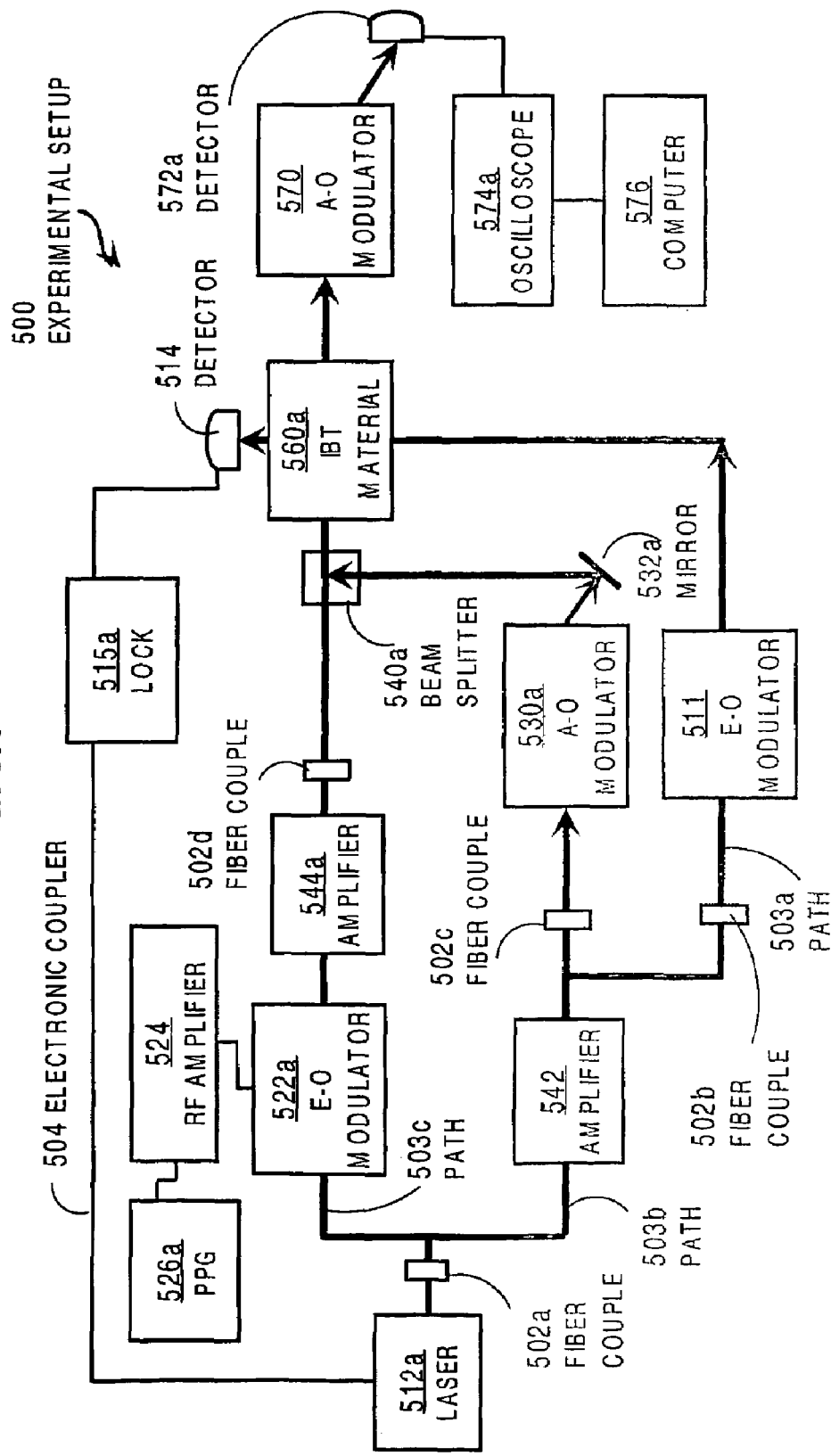

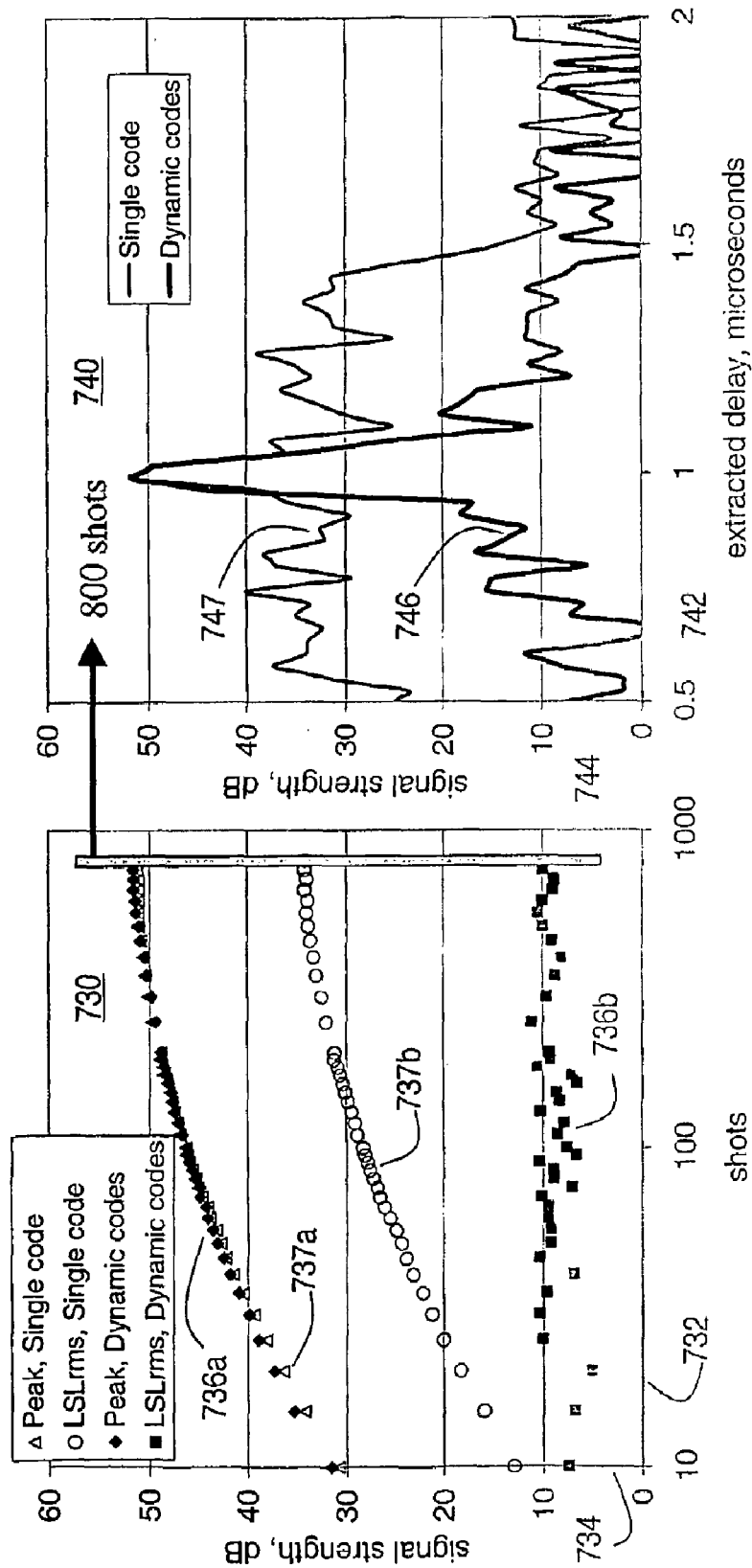

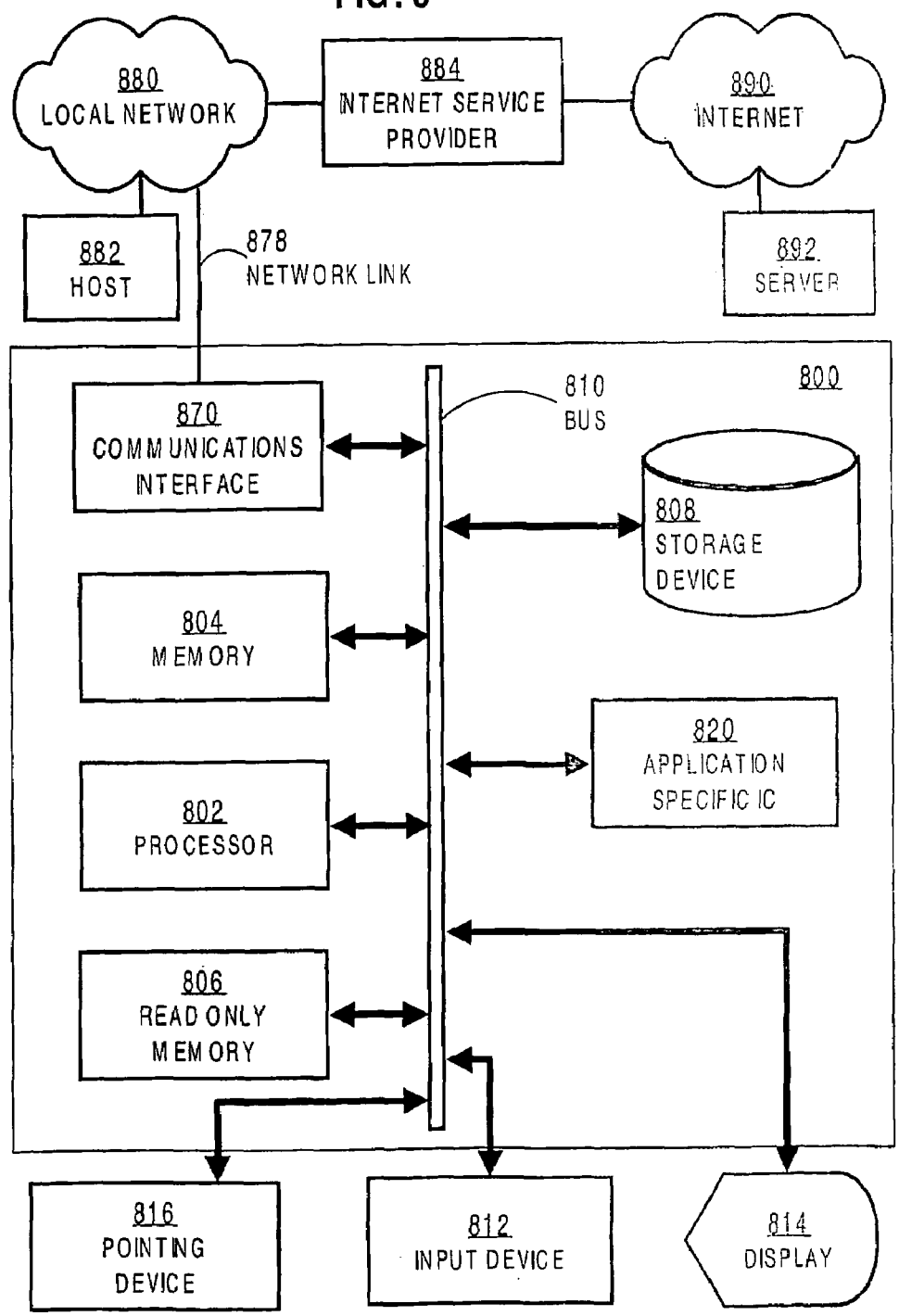

METHOD AND APPARATUS FOR PROCESSING HIGH TIME-BANDWIDTH SIGNALS USING A MATERIAL WITH INHOMOGENEOUSLY BROADENED ABSORPTION SPECTRUM

CROSS-REFERENCE TO RELATED APPLICATIONS

This application claims benefit of Provisional Appln. 60/378,059 filed 16 May 2002, the entire contents of which are hereby incorporated by reference as if fully set forth herein, under 35 U.S.C. §119(e).

STATEMENT OF GOVERNMENTAL INTEREST

This invention was made with Government support under Contract No. NAG2-1323 awarded by the National Aeronautics and Space Administration. The Government has certain rights in the invention.

BACKGROUND OF THE INVENTION

1. Field of the Invention

The present invention relates to use of an inhomogeneously broadened transition (IBT) material or spatial-spectral ($S^2$) material to achieve optical analog signal processing, and in particular to processing analog, large dynamic range, high bandwidth, large time-bandwidth-product signals in the material.

2. Description of the Related Art

Real time analog large dynamic range signals with large time-bandwidth products (TBP, the product of a signal's bandwidth and its duration, typically considered large when in excess of $10^4$) present a challenge for conventional digital processing. Such signals can arise in a variety of applications, including modern secure radio frequency detection and ranging (RADAR), light detection and ranging systems (LIDARs), Optical Time Domain Reflectometry (OTDR), spectral analysis and radio astronomy, among others. Other such signals are expected in a wide range of technical fields, including medical imaging devices, such as computer-assisted tomography (CAT) scans and nuclear magnetic resonance imaging (MRI), among others.

For example, the performance of arrayed RADAR systems depends strongly on the bandwidth and duration of signals the system can process in real time. Current RADAR systems are limited by available signal acquisition and processing technologies to bandwidths of a few hundred MegaHertz (MHz, 1 MHz=$10^6$ Hertz, Hz; a Hz is a cycle per second). Bandwidth directly translates into range resolution. Some applications, such as target recognition for missile defense systems, demand higher bandwidth signals in the range of multiple GigaHz (GHz, 1 GHz=$10^9$ Hz), at least a factor of ten greater than the available technologies. Coherent signal processing over multiple coherent acquisitions that are integrated means in RADAR to obtain the Doppler shift of a return signal, as well.

Based on the foregoing, there is a clear need for developing signal acquisition and processing technologies for signals with bandwidths greater than 1 GHz and TBPs greater than $10^4$.

Advances in the growth and study of doped crystalline structures at extremely low temperatures (cryogenic temperatures), have revealed that the doping of certain rare earth ions in a certain way produces an inhomogeneously broadened transition (IBT) in these materials that display useful optical absorption properties. Materials that exhibit this IBT are called IBT materials. The absorption demonstrates optical frequency selectivity over bandwidths typically far greater than 1 GHz and with frequency resolution typically far less than 100 kiloHertz (kHz, 1 kHz=$10^3$ Hz). The ratio of bandwidth to resolution, which corresponds to a TBP, has been reported as high as $10^8$ in some materials, and is generally considered useful when greater than $10^4$. Therefore processors based on IBT materials have the potential to be able to provide signal acquisition and processing technologies for signals with bandwidths greater than 1 GHz and TBPs greater than $10^4$.

The absorption features of ions or molecules doped into inorganic materials are spectrally broadened by two main classes of mechanisms. Homogeneous broadening is the fundamental broadening experienced by all ions or molecules independently, and arises from the quantum-mechanical relationship between the frequency lineshape and the dephasing time of the excited electron in the ion or molecule. Inhomogeneous broadening arises from the overlap of the quasi-continuum of individual spectra of all of the ions or molecules in the crystal, which have microscopically different environments and therefore slightly different transition frequencies.

The frequency selectivity can be modified locally by interaction with optical signals that excite electrons in the molecules that serve as absorbers from a ground state to an excited state, thereby removing those electrons and their host ions or molecules, at least temporarily, from the population of absorbers at that location in the material. Therefore, some such materials have been used to form highly frequency selective spatial-spectral gratings, and these materials are sometimes called spatial-spectral coherent holographic materials ($S^2$ materials). After some time, the electrons may return to the ground state and the grating decays. When electrons are removed from the ground state in a particular homogeneously broadened absorption peak, a "hole" is said to be "burned" in the absorption of the material at that frequency, aid light at the frequency of the hole is transmitted with less absorption. Spectral gratings and spectral holes (features of spectral gratings) may be made permanent in some applications. Spectral grating and spectral holes are general terms that are interchangeable and herein are used interchangeably to describe aspects of a modified absorption profile.

Some IBT materials have been used as versatile optical coherent transient (OCT) processing devices. An OCT device is one with a broadband spectral grating in the optical range that extends over several homogeneous lines, and part or all of the available inhomogeneous broadening absorption profile. All the components of an optical spectral grating are typically formed simultaneously by recording the spatial-spectral interference of two or more optical pulses separated in time and/or space. When a grating is formed in the IBT material, the processor is said to be programmed, and the grating can be referred to as a device. This spatial-spectral grating has the ability to generate a broadband optical output signal that depends on an optical input probe waveform (referred to as a processing waveform) impinging on that grating and the programming pulses that formed the grating.

Various optical coherent transient (OCT) devices have been disclosed, such as an optical memory (for example, T. W. Mossberg, "Time-Domain Frequency-Selective Optical Data Storage," Opt. Lett. 7,77 1982, and "Time domain data storage," T. W. Mossberg, U.S. Pat. No. 4,459,682, Jul. 10, 1984), a swept carrier optical memory (for example, T. W. Mossberg, "Swept Carrier Time-Domain Optical Memory,"

Opt. Lett. 17,535, 1992, and "Swept-carrier frequency selective optical memory and method," T. W. Mossberg, U.S. Pat. No. 5,276,637, Jan. 4, 1994), an optical signal cross-correlator (for example, W. R. Babbitt and J. A. Bell, "Coherent Transient Continuous Optical Processor," Appl. Opt. 33,1538, 1994, and W. R. Babbitt and J. A. Bell, "An optical signal processor for processing continuous signal data," U.S. Pat. No. 5,239,548 Aug. 24, 1993), "Coherent time-domain data storage with spread-spectrum data pulse," Yu Sheng Bai, Ravinder Kachru, U.S. Pat. No. 5,369,665, Nov. 29, 1994, "Optical cross-correlation and convolution apparatus," Thomas W. Mossberg, Yu-Sheng Bai, William R. Babbitt, and Nils W. Carlson, U.S. Pat. No. 4,670,854 Jun. 2, 1987, "Reprogrammable matched optical filter and method of using same," Xiao An Shen, Yu Sheng Bai, Eric M. Pearson, U.S. Pat. No. 5,381,362, Jan. 10, 1995), as an optical true-time delay regenerator (see for example, K. D. Merkel and W. R. Babbitt, "Optical Coherent Transient True-time Delay Regenerator," Opt. Lett. 21, 1102, 1996), optical spatial router (for example, W. R. Babbitt and T. W. Mossberg, "Spatial Routing of Optical Beams Through Time-domain Spatial-spectral filtering," Opt. Lett. 20, 910, 1995, and W. R. Babbitt and T. W. Mossberg, "Apparatus and methods for routing of optical beams via time-domain spatial-spectral filtering," U.S. Pat. No. 5,812,318, Sep. 22, 1998), as means to continuously refresh and continuously use a spectral grating (published PCT patent application WO2000-38193 "Coherent Transient Continuously Programmed Continuous Processor") and as a means to achieve processing and variable time delay (published PCT patent application WO2001-18818 "Method And Apparatus For Variable Time Delay Optical Coherent Transient Signal Processing.") the entire contents of each of which are hereby incorporated by reference as if fully set forth herein, among others.

In these OCT devices, the readout approach typically uses high bandwidth optical signals, such as a coherent brief optical pulse or a series of coherent brief optical pulses, to probe the spectral grating, which under certain conditions can produce optical output signals that are generally referred to as stimulated photon echoes. A single brief coherent light pulse with the full spectral grating processing bandwidth stimulates a time-delayed output signal whose temporal profile represents the Fourier transform of the spectrum recorded in the grating structure. Thus a grating that represents the multiplication of the spectra of two programming pulses outputs a time-delayed signal whose temporal profile represents the convolution of those two pulses, e.g., the cross correlation profile of the two programming pulses. Probing with a series of brief coherent light pulses stimulates a photon echo signal whose temporal profile represents the correlation of the probe pulse with the Fourier transform of the spectrum recorded in the grating structure, creating real time processing ability of the probe pulse with a programmed spectral grating.

Frequency chirped pulses that are shorter in duration than the coherence decay time of the homogeneously broadened absorption lines have been used to probe spectral population gratings in inhomogeneously broadened absorbers. The result is a temporal output signal that is limited in duration by the coherence decay time. For example, chirped pulses can be used to store and recall temporal data (Y. S. Bai, W. R. Babbitt, and T. W. Mossberg, "Coherent Transient Optical Pulse Shape Storage/Recall Using Frequency-Swept Excitation Pulses," Opt. Lett. 11, 724 (1986).) and used to generate arbitrary waveforms (Z. Barber, M. Tian, R. Reibel, and W. R. Babbitt, "Optical pulse shaping using optical coherent transients", Opt. Exp. 10, 1145-1150 (2002)). The chirp rates of the chirped probe pulses used in these examples are fast and do not generate a temporal map of the structure of the spectral population grating. These chirped probes generate a temporal output signal that represents a collective readout of the spectral population grating, not its individual components, with bandwidths of the temporal output typically equal to the bandwidth that was excited in the medium, i.e. the bandwidth of the chirp. High bandwidth detectors are thus needed to record the outputs from this manner of chirped readout.

While potentially useful in many applications, the approach of readout creating an optical pulse or series of optical pulses at the full bandwidth of processing suffers, at present, from the limited performance in dynamic range of photo-detectors and digitizers that are needed to make a measurement of any high bandwidth optical signal. Existing high bandwidth detectors and analog to digital converters (ADC's also called "digitizers" herein) have limited performance (and are also far more expensive) as compared to lower bandwidth detectors and digitizers. For example, currently available detectors with bandwidths greater than 1 GHz have about 30 deciBels (dB) of dynamic range. Dynamic ranges of about 90 dB or more are preferred, which axe presently available for photo-detectors with bandwidths on the order of 1 MHz and ADCs with operation sample rates on the order of 10 Mega-samples per second (Ms/s).

In addition to the detection difficulties with high bandwidth signals, inefficiencies of such approaches of readout require that the high bandwidth probes have high power. Such high power probes are difficult or expensive to create, further impeding the implementation of these readout approaches.

Based on the foregoing, there is a clear need for a processor of high bandwidth signals that makes use of the TBP potential of IBT materials and that does not suffer the disadvantages of prior art approaches.

SUMMARY OF THE INVENTION

Techniques are provided for optical analog processing of high time-bandwidth-product (TBP) signals. Multiple processing acquisitions can be integrated in the IBT material. The low bandwidth, high quality analog optical output signal from the device represents the results of high bandwidth optical processing and includes, in some embodiments, integration over several sets of interacting signals. The analog output signal is photo-detected and digitized with high precision to produce a digital output. In one embodiment, a method includes causing an input signal on an optical carrier to interact in a material with an inhomogeneously broadened absorption spectrum including a plurality of homogeneously broadened absorption lines to record an interaction absorption spectrum. Within about a population recovery time for a population of optical absorbers in the material, the interaction absorption spectrum is read to produce a readout signal that represents a temporal map of the interaction absorption spectrum. The readout signal indicates frequency components of the input signal According to an aspect of the invention, wherein an aspect is a set of embodiments, a method includes causing a first set of signals on optical carriers to interact in an IBT material. The IBT material has an inhomogeneously broadened absorption spectrum including a plurality of homogeneously broadened absorption lines. A population of optical absorbers in the material that are in an excited state return to the ground state on a scale characterized by a population recovery time. The first set of signals on optical carriers interact in the material during a time on the order of a phase coherence time of the homogeneously broadened absorption lines to record an analog interaction absorption spectrum. Within a time on the order of the population recovery time, the interaction absorption spectrum in the material is read to produce a readout signal. The readout signal represents a temporal map of the interaction absorption spectrum, and includes frequency components that relate to a processing result of processing the first set of signals.

According to some embodiments of this aspect, the interaction absorption spectrum in the material is read by measuring absorption of a frequency chirped optical signal directed into the material. In some embodiments, the measurement bandwidth of the interaction absorption spectrum covers all or part of the actual absorption spectrum bandwidth.

In some embodiments, the measurement of the interaction absorption spectrum produces a readout signal with a bandwidth that is substantially less than a minimum bandwidth of the first set of signals.

According to some embodiments of this aspect, before a readout time on the order of the population recovery time expires after the first set of signals, an additional set of signals on optical carriers is directed along the same spatial mode in the material as the original set of signals. The additional set is directed along the mode at a repetition time after an immediately previous set of signals. The interaction absorption spectrum integrates a spectrum that represents an interaction among signals in the additional set of signals.

According to some embodiments of this aspect, the first set of signals on optical carriers interact differently in each spatial mode of a set of spatial modes through the material to record a corresponding set of interaction absorption spectra. Reading the interaction absorption spectrum includes reading the corresponding set of interaction absorption spectra to produce a corresponding set of readout signals. Each readout signal includes frequency components that relate to a processing result of processing the signals in a corresponding spatial mode.

In some of these embodiments, a particular signal from the first shot of signals is frequency shifted by a different frequency shift for each spatial mode of the corresponding set of spatial modes. The method further includes determining a Doppler shift based on a particular frequency shift applied at a particular spatial mode associated with a particular readout signal.

According to another aspect of the invention, an apparatus includes a signal input port for receiving a signal set of one or more shots of input signals. The apparatus includes a material with an inhomogeneously broadened absorption spectrum including a plurality of homogeneously broadened absorption lines. The apparatus also includes a first optical coupler to direct a plurality of modulated optical signals onto the material in a set of one or more spatial modes. The modulated optical signals are based on each shot of input signals in the signal set. The modulated optical signals are directed onto the material within about a phase coherence time of a homogeneously broadened absorption line to record an interaction absorption spectrum that represents spectral processing of the shot. The apparatus further includes a source of a probing signal and a detector. The detector measures, with time, a readout signal based on the interaction absorption spectrum and the probing signal. The readout signal represents a temporal map of the interaction absorption spectrum and includes frequency components that relate to a processing result of processing the first plurality of signals.

According to another aspect of the invention, a system includes an optical analog processing device, a RADAR signal conditioner, and a RADAR processor. The optical analog processing device includes a signal input port, a IBT material, an optical coupler, a source of a probing signal, and a detector. The signal input port receives a signal set of one or more shots of input signals. The IBT material has an inhomogeneously broadened absorption spectrum including a large number of homogeneously broadened absorption lines. The optical coupler directs modulated optical signals based on each shot onto the material in a set of one or more spatial modes within about a phase coherence time. The phase coherence time is related to a homogeneously broadened absorption line. The optical coupler directs the modulated optical signals onto the material to record an interaction absorption spectrum that represents spectral processing of the shot. The detector measures, with time, a readout signal based on the interaction absorption spectrum and the probing signal. The readout signal represents a temporal map of the interaction absorption spectrum and includes frequency components that relate to a processing result of processing the first plurality of signals. The RADAR signal conditioner selects a first set of one or more signals and a second set of one or more signals. The first set of one or more signals is based on one or more RADAR transmitted signals. The second set of one or more signals is based on one or more received signals, which are based on the one or more RADAR transmitted signals after reflection from a target. The conditioner sends the first set of signals and the second set of signals to the signal input port of the analog optical processing device. The RADAR processor determines range or Doppler shifts, or both, with high resolution to the target based on the readout signal in the analog optical processing device.

BRIEF DESCRIPTION OF THE DRAWINGS

The present invention is illustrated by way of example, and not by way of limitation, in the figures of the accompanying drawings and in which like reference numerals refer to similar elements and in which:

FIG. 1A is a graph that illustrates a homogeneously broadened absorption spectral line and an inhomogeneously broadened absorption spectrum in an IBT material;

FIG. 1C is a time line that illustrates timing of several example signals processed in the IBT material, according to an embodiment;

FIG. 1D is a graph that illustrates an example interaction absorption spectrum formed in an IBT material, according to an embodiment;

FIG. 1E is a graph that illustrates a cross-correlation curve as a processing result, according to an embodiment;

FIG. 3B is a block diagram that illustrates a component of frequency shifter array, according to an embodiment;

FIG. 5A is a block diagram that illustrates an experimental setup for demonstrating delay processing, according to an embodiment near 1536 nm;

FIG. 7C is a graph that illustrates a dependence on number of shots of the peak in a cross correlation derived from a readout signal using multiple pulse patterns and a fixed pulse pattern, according to an embodiment near 793 nm;

FIG. 7D is a graph that illustrates a dependence on multiple pulse patterns of the cross correlation derived from a readout signal, according to an embodiment near 793 nm; and FIG. 8 is a block diagram that illustrates a digital computer system upon which portions of an embodiment of the invention may be implemented.

DETAILED DESCRIPTION

Figure 1B:
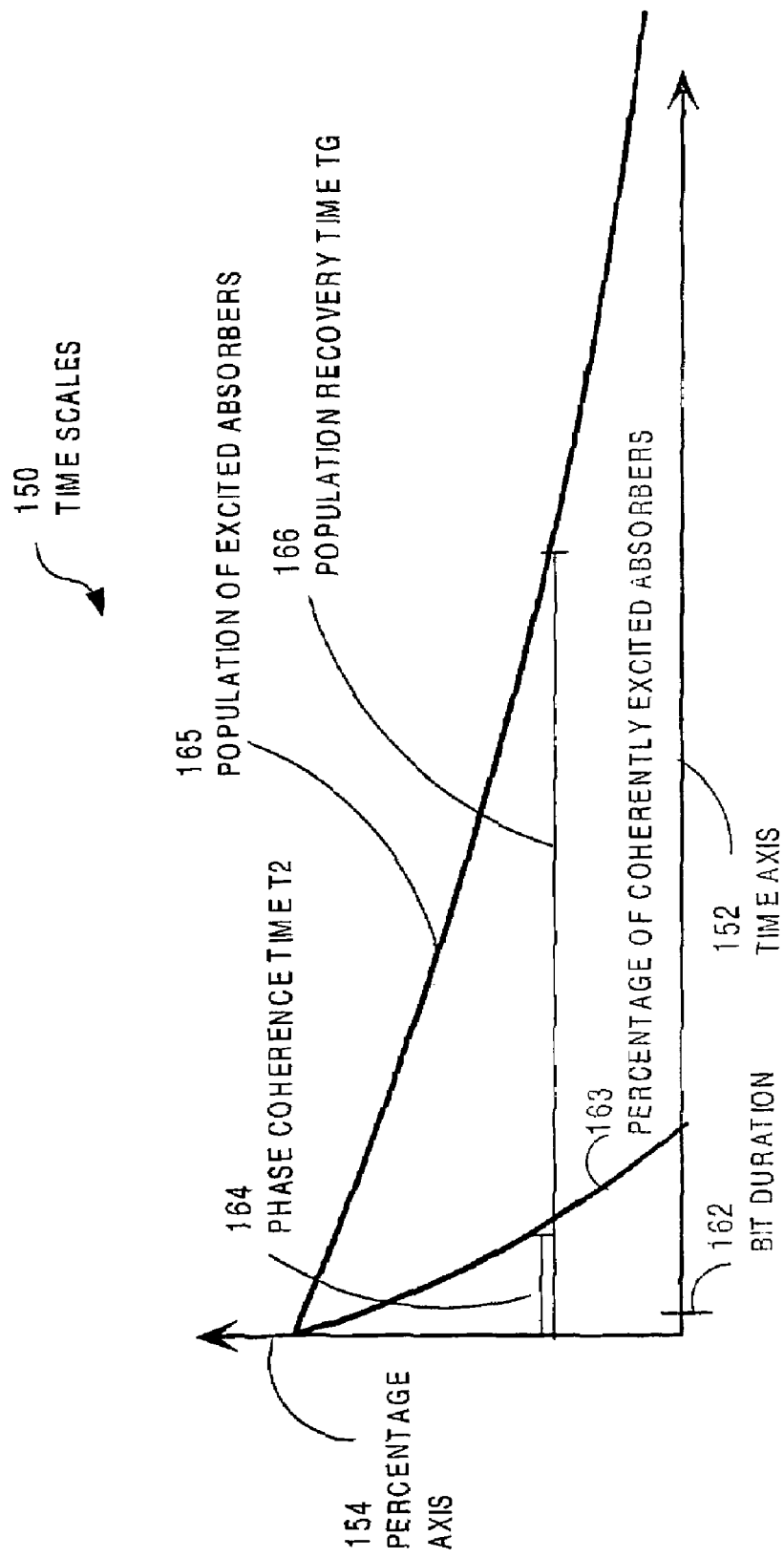
FIG. 1B is a graph that illustrates time scales associated with signals processed in the IBT material, according to an embodiment.

A method and apparatus and system for processing high TBP signals are described. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

Embodiments of the invention are described in the context of processing RADAR transmitted and received signals for improved range resolution and improved resolution of Doppler shifts, but the invention is not limited to this context. Embodiments of the invention may be practiced for processing of fewer signals, more signals and different signals, including processing any signals that use different frequency bands and/or spatial configurations to represent data, including LIDAR data, OTDR data, noise LIDAR data, laser RADAR data, radio frequency (RF) signal data (such as noise RADAR data, RF spectral analysis data and RE spectral estimation data), radio astronomy data and data in other technical fields, such as medical imaging data.

For example, embodiments of the invention maybe used in active RADAR for single-element antenna, or large multi-element phased arrays, for range in mid- to high-pulse Doppler, target identification, moving target indications, and for synthetic and inverse synthetic aperture RADAR Embodiments may be used in passive RF receiver systems for intercepting transmissions, for detecting stealth communications, and for analyzing frequency-hopping radio. Embodiments may be used in radio astronomy for analyzing radio astronomy signals, and for searching for extra-terrestrial intelligence. Embodiments may be used in LIDAR and laser RADAR for wind shear measurements, atmospheric monitoring and weather prediction, for pollution monitoring, and for space-based tracking of satellites and other targets.

1. IBT Materials

FIG. 1A is a graph that illustrates a homogeneously broadened absorption spectral line 110 and an inhomogeneously broadened absorption spectrum 120 in an IBT material. The frequency axis 102 represents frequencies (f), in Hz, increasing to the right. The absorption axis 104 represents the population (N(F)) of absorbers, which are available to absorb light, and is related to the absorption of light per unit length along a spatial path into the material. The graph depicts a homogeneously broadened absorption spectral line 110 centered on line center frequency 103, which has a homogeneous line bandwidth proportional to the reciprocal of a time T2.

As explained in more detail below, a large number of homogeneously broadened absorption lines for absorbers spread throughout an inhomogeneous crystal results in an inhomogeneously broadened absorption spectrum 120. The inhomogeneously broadened absorption spectrum 120 has a band center frequency 105 and an inhomogeneous spectrum bandwidth 122, also represented by the symbol B, or $B_M$ for the material bandwidth, or $\delta\omega_I$. The band center frequency is in the optical band, which encompasses frequencies from 100 to 1000 TeraHz (THz, 1 THz=$10^{12}$ Hz). However, the inhomogeneous spectrum bandwidth 122, B, is typically less than a few THz—large compared to the bandwidths available for RADAR processing but small compared to the hundreds of THz bandwidth of the optical band.

The intrinsic frequency selective properties of IBT materials are derived from the sharp resonance $\delta\omega_H$ of electrons in ions and molecules in cryogenic solids, where the resonance $\delta\omega_H$ is proportional to the homogeneous line bandwidth, e.g. homogeneous line bandwidth 112 in FIG. 1A. These sharp resonances can be below 1 kHz, and are typically in the range of 1 kHz to 100 kHz. Inversely proportional to the homogeneous line bandwidth is the phase coherence time, T2, also called the homogeneous dephasing time, which is the time scale for coherent, phase-sensitive transitions between the ground state and the excited state for a homogeneous set of absorbing electrons.

When an electron makes the transition to the excited state because of light impinging at a particular location in the material, there is one fewer absorber at that location. Therefore, the population of absorbers decreases and the absorption decreases at that location. If there are few enough absorbers in the location, or if enough photons excite enough electrons, the decrease in the population of absorbers, and the resulting decrease in absorption at the particular line frequencies that match the photon frequencies is appreciable. For example, after enough photons with frequencies within absorption line 110 impinge on a location in the material, the absorption peak associated with absorption line 110 at that location decreases, and the absorption spectrum 120 has a dip centered near the line center frequency 103.

Members of a population of excited electrons gradually return to the ground state, and the population of absorbers, along with the absorption, returns to its initial value. The time scale associated with this process is the population recovery time, TG. For example, the dip in absorption spectrum 120 at line frequency 103, described above, fills in exponentially with a time constant on the order of TG. The value of TG depends on the material and the return path through any intermediate states to the ground state.

The ability of IBT materials to process broadband signals stems from the inhomogeneous broadening bandwidth, $\delta\omega_I$, e.g. inhomogeneous line bandwidth 122 in FIG. 1A. The inhomogeneous broadening is typically caused by defects found in the crystalline host of the absorbing molecule or ion. These local defects, the "inhomogeneities," cause similar ions to have different resonant frequencies, but do not broaden the individual homogeneous resonances. The broad inhomogeneous bandwidth 122 determines the processing bandwidth of the material.

An appropriate IBT can be found in at least three types of material systems:
1) a system with a two-level transition between a ground electron state |1> and an upper electron state |2>;
2) part of a three-level system of electron states with an intermediate bottleneck state |3> that slows down the decay process back to the ground state |1>; and
3) part of a multiple-level system, with three or more levels, including state |3> and zero or more other states |n> where n>3, which may or may not provide gain. In all of these systems, T1 is the population decay time of the upper state |2>, T2 is the coherence time of the transition between lower state |1> and upper state |2>, and TB is a decay time of a bottleneck or pumped state |3>. In all of these systems, the radiation field of the interacting light beams only couples states |1> and |2>. In the multiple-level system with gain, there is typically one or more electron states above or below states |1> and |2>. A population of electrons in the resonant states |1> and |2> is provided by adding energy to (pumping) electrons at natural state |3> with electromagnetic waves at entirely different frequencies from the interacting optical beams. The excited electrons can go to state |1> directly or indirectly by decaying from state |2> or some other state |n>.

2. IBT Material Time Scales

FIG. 1B is a graph that illustrates time scales associated with signals processed in the IBT material, according to an embodiment. The time axis 152 represents time increasing to the right. The percentage axis 154 represents the percentage of absorbers relative to an initial number of absorbers in a given state at time zero, increasing upward.

It is assumed for purposes of illustration that a material is selected in which the population recovery time, TG, is long compared to the phase coherence time T2. Curve 163 represents the percentage of absorbers in a homogeneous crystal environment that are coherent after excitation. This percentage decreases exponentially on a time scale 164 equal to the phase coherence time T2, which is inversely proportional to $\delta\omega_H$. Curve 165 represents the percentage of absorbers in the excited state, relative to an initial population in the excited state after passage of an optical signal. This percentage decreases exponentially also, but more gradually, with a longer time scale 166 equal to TG.

Also shown in FIG. 1B is the useful bit duration 162 for coded modulation (phase and/or amplitude), which is the inverse of the useful bandwidth $\delta\omega_I$. Bit durations shorter than bit duration 162 generate frequency components that do not fall within the useful bandwidth $\delta\omega_I$ (the inhomogeneous spectrum bandwidth 122). Since $\delta\omega_I$ is greater than $\delta\omega_H$, the bit duration is necessarily less than the phase coherence time T2.

For optical signals to interact coherently in the material, the interacting signal or signals must reach the same location in the material within a time on the order of the phase coherence time T2. Thus, to correlate a reference signal and its delayed reflected counterpart, as in the RADAR problem, the reflected signal must impinge on the same volumetric location in the material within a useful time interval relative to T2 after the reference signal arrives at that location. Thus, a material should be selected with a phase coherence time large enough to encompass the delays of interest 3. Signal Time Scales FIG. 1C is a time line that illustrates timing of several example signals processed in an IBT material, according to an embodiment. For purposes of illustration, the signals are discussed in the context of determining the delay between a signal and its replica, which is a simple surrogate for determining the range to a target from a transmitted and reflected RADAR pulse.

The optical signals are inherently analog in nature and can be any representation of information by modulation techniques or any combination of modulation techniques (amplitude, frequency, phase, etc.). Thus, any method of representing a value on an optical carrier may be used. For purposes of illustration, it is assumed that the value is a bit that represents one of two opposite phases for the optical carrier. Such encoding of values on an optical carrier is called binary phase-shift keying (BPSK). In other embodiments, other forms of encoding may be used. For example, the phase may be allowed to vary proportionally to a value being encoded. In this case the value is not binary and the bit value axis would be replaced with a variable value axis. The value on the variable axis may be called a chip value and the unit of information a chip instead of a bit.

The time axis 172 represents time increasing to the right. The bit value axes 174a, 174b (collectively referenced hereinafter as bit value axes 174) represents one of two values for each bit; one value represented by the top of each axis 174, and another by the bottom of each axis 174. It is assumed for purposes of illustration that the bit duration, each bit's width on the time axis, is the minimum useful bit duration inversely proportional to the useful bandwidth 122. The optical carrier has a frequency within the inhomogeneously broadened absorption spectrum 120 of FIG. 1A or 1D. It is assumed for purposes of illustration that the optical carrier frequency is at or near the band center frequency 105.

In the embodiment depicted in FIG. 1C, a first signal 182, representing, for example, a transmitted RADAR pulse, is made up of a sequence of bits, represented by the vertical oscillation between bit values. The ellipses imply that the signals can be longer than those shown, so that the signals can be temporally overlapping in time. A second signal 184, representing, for example, a reflected RADAR pulse, includes a similar sequence of bits that arrive after a delay time 175*a*. In practice for the RADAR case, this second signal will be attenuated and altered by external factors, and therefore a noisy analog waveform. In general, the received signal can be a superposition of multiple target returns. For purposes of illustration, only one perfect target return is shown. For these two signals to effectively interact in the IBT material, the delay time 175*a* should be on the order of the phase coherence time or less. The first signal and the second signal constitute a first set of signals 180, called a shot. In other embodiments, mole signals may be included in the first set of signals to interact.

FIG. 1C also depicts a second set of signals 185 that includes a third signal 186 and a fourth signal 188 that represents the delayed counterpart of the third signal 186 with a delay 176*b*. For the RADAR case with a pulse repetition interval, the third signal arrives after the first signal by a repetition interval 177, represented by the symbol $\tau_R$. In the general case, the first and second signal can be continuous, thus with no repetition interval. In this case the signals interact constantly over the phase coherence time T2 as a sliding time window of interaction. In illustrated embodiments, described in more detail below, the repetition interval $\tau_R$ is typically greater than the phase coherence time T2, so that the third and fourth signals minimally interact with the first and second signals.

4. Spectral Results

If the signals have sufficient intensity, then the absorption spectrum in the material where the two signals interact reflects a complex spectral interaction of the spectral content of the two signals, as described in more detail below. FIG. 1D is a graph that illustrates an example interaction absorption spectrum 190 formed in an IBT material, according to an embodiment. The axes 102, 104, the band center frequency 105 and the inhomogeneously broadened spectrum 120 are the same as they are in FIG. 1A. The example interaction absorption spectrum 190 differs from the inhomogeneously broadened absorption spectrum 120 by an amount that represents the spectral content of the interaction of the signals in the first set.

The mathematical operations of analog signal processing (e.g., convolutions and correlations in time) can be implemented as frequency domain multiplications. As is well known, the interaction of two signals in the same volume through an IBT material yields the multiplication of cross terms in the complex Fourier transforms of the temporal input signals modified by the effects of a finite phase coherence time. The following theoretical explanation is provided to help describe embodiments of the invention; however the invention is not limited to this theory.

It is assumed that the first signal 182 is represented by the temporal function E1(t) of time t; and that the second signal 184 is represented by the temporal function E2(t–$\tau_D$), where the two signals are separated by delay $\tau_D$. The Fourier transforms of the two signals are represented by F1($\omega$) and F2($\omega$)$e^{-i\omega\tau_D}$, respectively. The term $e^{-i\omega\tau_D}$ represents a complex phase angle. Both signals interact at a location in the IBT material within the delay time $\tau_D$. The interaction complex power spectrum, represented by $|F12(\omega)|^2$, is the square of the sum of the of the electric fields, which follows in Equation 1.

$$|F12(\omega)|^2 = |F1(\omega)+F2(\omega)e^{-i\omega\tau_D}|^2 = |F1(\omega)|^2+|F2(\omega)|^2+ \\ F1^*(\omega)F2(\omega)e^{-i\omega\tau_D}+F1(\omega)F2^*(\omega)e^{+i\omega\tau_D} \quad (1)$$

The interaction power spectrum includes the power spectra of the first and second signals as the first two terms in the last line of Equation 1, and cross terms that contain the interference of the power spectrum of each pulse. The cross terms include the full amplitude and phase information of each pulse and a strong periodic component with frequency inversely proportional to the delay $\tau_D$ between the signals.

The magnitude of the Fourier transform of the interference terms yields a cross correlation curve with a peak at the periodic component that represents the delay $\tau_D$. FIG. 1E is a graph 191 that illustrates a cross-correlation curve 196 as a processing result, according to an embodiment with a strong periodic component. The time axis 192 represents delay time between the two signals, increasing to the right. The amplitude axis 194 represents the amplitude of cross correlation of the two signals at a given delay, increasing upward.

The curve 196 is derived by taking the Fourier transform of the interaction absorption spectrum. The peak 197 indicates that the signals correlate most strongly when the second signal contains components of the first signal that are shifted by the delay 198. For the first signal 182 and the second signal 184, the delay 198 associated with peak 197 is expected to equal the delay 175 between those two signals.

With the appropriate intensities of the interacting signals and the appropriate number of available absorbers, the interaction spectrum of the signals can be represented in the material as an interaction absorption spectrum, also referred to as a spectral population grating, with a large dynamic range.

The interacting beams carrying the signals may be collinear, passing through the same spatial modes, or intersect at one or more angles, along two or more intersecting spatial modes. In embodiments in which the same spatial mode is used for the interacting signals, the grating produced is purely spectral and the processing stage is simplified. The readout stage can be along the same spatial mode or slightly angled to the processing modes. In embodiments in which different interacting beams are introduced on two or more spatial modes that are angled, the grating produced is both spectral and a spatial. This grating can be read along a specially chosen readout direction, either coherently or incoherently. Although for the general case, a grating is both spectral and spatial, the processed information due to the interaction of signals is purely spectral at any given specific location. Unless otherwise stated, these spatial-spectral population gratings are referred to as spectral population gratings or interaction absorption spectra henceforth.

5. Integration

Subsequent signals that arrive after T2 but within TG create an interference spectrum that is recorded as a spectral population grating in addition to the spectral population grating previously recorded in the material. This sum of the interaction spectra of multiple shots enhances features of the spectral population grating that are common to each shot. Thus introducing another set of interacting signals to measure the same thing, e.g., the delay between transmittal and reception of a RADAR signal can add to the dynamic range of the spectrum recorded in the material. This process is referred to as integration.

However, the recorded spectrum decays away over die population recovery time TG. Therefore, integration should be completed before a time on the order of TG, and the recorded spectrum can be measured within several TG, as desired, with respect to signal strength considerations.

FIG. 1C shows the relationship between coherent interaction and incoherent integration of spectral content in signals that are introduced at repetition interval 177. The first set of signals 180, called a shot, are introduced to the IBT material typically within a time on the order of T2 to form an interaction spectrum that is recorded in the material. A second shot of signals 185 is introduced after repetition interval 177, represented by the symbol $\tau_R$, that should be long compared to T2 to insure that coherences from the first shot have sufficiently decayed so as not to significantly interfere with coherences from the second shot, as desired with respect to signal strength considerations. However, this is not a requirement and depends on the implementation. The signals in the second shot interact to form another coherent interaction resulting in an interaction spectrum that is recorded in addition to the spectrum already there, as long as repetition interval $\tau_R$ is short compared to the population recovery time TG. For example, to include N shots before the population recovers by a factor ~⅓, $N \times \tau_R$ should be less than TG.

If the property of interest is the delay time, it is not necessary that the first signal 182 in the first shot 180 and the third signal 186 in the second shot 185 be identical. The periodic component representing the delay will be integrated even if the power spectra of the individual signals are not the same. Therefore, in the RADAR delay problem, different transmit signals may be used in each shot. Furthermore, in the most general case, the signals in each shot are not identical. When the signals are different in each shot, the integration of the interaction spectra still provides the cross-correlation of signals. In this general scenario, there is no lower bound on $\tau_R$. For example, in radio astronomy, where continuous signals comprise a single set, the cross correlation of these signals is desired, and it is a rare occurrence when signals are identical.

6. Array Processing

The spectral processing described above occurs in a part of the material illuminated by both the processing signals, which may be only one spatial mode through the material for determining correlations, or an intersection volume of two or more spatial modes. Separate processing can be performed in other volumes using other spatial modes through the material. The separate processing may include processing signals from different systems and burning holes for data storage or for stabilizing laser frequencies. The separate processing can be parallel operations for parallel signals. For example, in array antennas with multiple elements, the signals from all the elements could be processed in parallel. The use of multiple different spatial modes in the material simultaneously is called array processing.

For example, in the RADAR application, the return signal from a moving target is not only delayed in time, but also shifted in frequency by an amount called the Doppler shift that is proportional to the targets' longitudinal velocity. When a reference signal based on the transmitted signal interacts with a frequency shifted return, the individual correlation is processed with the frequency difference corresponding to a mismatch of the spectral content and corresponding phase shift. However, when integrating multiple spectrum correlations, the strength of integrated spectral correlations are diminished when a reference signal based on the transmitted signal interacts with a frequency shifted return. In RADAR systems, Doppler shifts are typically in the range of 100 Hz to 100 kHz.

The frequency shift of the return can be determined by replicating the transmitted signal multiple times in various spatial modes, and shifting each replica by a different frequency shift (including zero and negative frequency shifts in some embodiments). The reflected signal is replicated the same number of times but with no frequency shift. Each replica of the reflected signal interacts with a different frequency shifted replica of the transmitted signal in a different spatial mode. Different interaction spectra are recorded in the different spatial modes. The integrated interaction absorption spectrum that leads to the strongest frequency components in the readout signal, or eventually the greatest correlation peak, is the one with the transmitted replica shifted by an amount closest to the Doppler shift in the reflected signal. Thus a strong correlation peak and the Doppler shift are simultaneously determined using array processing in the multiple spatial modes available in the IBT material.

7. Readout, Detection and Analog-to-Digital Conversion for Post Processing

Reading the absorption spectrum recorded in the IBT material can be achieved by an optical signal whose carrier frequency is a pure sinusoidal signal that is swept slowly compared to the period of the carrier over the used frequencies in the absorption spectrum 120, without any other appreciable optical tones present.

Slow readout of the content of the spectral grating can be achieved by mapping the spectral structure in time using the chirped optical pulse described above. This process reduces the measurement bandwidth to the order of the spectral feature size of interest in the spectral grating. Since the desired high bandwidth processing is done in the material and recorded there, the sweep rate can be selected to be slow enough so that the features of the absorption spectrum are mapped onto the transmitted frequency chirped optical pulse. The transmitted pulse can be detected using low bandwidth photo-detectors to generate a low bandwidth readout signal. This electronic readout signal can be digitized with low bandwidth ADCs. This provides a major advantage over conventional high bandwidth readout using photon echo based effects, because low bandwidth optical to electrical (O/E) photo-detectors and ADCs are mature technologies with high dynamic ranges and also low cost.

In some embodiments, reading the frequency dependent absorption is clone with a sweep rate typically on the order of $1/(\tau_{Dmax})^2$, where $\tau_{Dmax}$ is the maximum, resolvable delay, to ensure sufficient temporal resolution. A consequence of this is that the bandwidth of detection is reduced to on the order of $1/\tau_{Dmax}$ rather than B, the bandwidth of the inhomogeneously broadened absorption spectrum. For example, if $\tau_{Dmax}=1.0$ µs, then the sweep rate can be 1.0 MHz/µs and the detection bandwidth is 1 MHz.

In some embodiments, the grating can be read with a slow coherent optical frequency swept pulse but by utilizing photon echo effects. In such cases, the output signal consists of stimulated photon echo signals from the grating due to the frequency swept pulse, which are by nature delayed from the coherent optical frequency swept pulse and can be on a unique spatial mode due to the input beam geometry. This geometry can generally be considered a box geometry, with the signals n=1, 2, 3 (n=1, first processing waveform; n=2, second processing waveform; n=3, chirped readout pulse) forming three vertices of a box with 2 and 3 on opposite corners. This is such that for a given vector, $K_0$, the individual unit wavevectors are $k_n = K_0 + \delta K_n$, where every $|\delta K_n|$ is equal, $\delta K_n$ is perpendicular to $K_0$ and $\delta K_3 = -\delta K_2$. The phase matching condition is $$k_S = k_3 + k_2 - k_1,$$

with the output signal direction forming the fourth spatial mode vertex of the box. The output signal and a replica of the readout chirp with a fixed time reference can be made to coherently interfere with each other on the detector to produce a low bandwidth electronic readout signal that can be digitized with an ADC. The choice of the chirp rate and grating feature size will determine the bandwidth of detection and digitization that is necessary.

The low bandwidth readout signal, once detected and digitized, can be post processed to determine its frequency content. This frequency content (f) corresponds to the time delay ($\tau_D$) information contained in the spectral population grating, converted via division of the frequency by the chirp rate ($\gamma$) used for readout, i.e., $\tau_D = f/\gamma$. As is well known, the chirp rate y is the readout bandwidth (Br) divided by the time of readout (Tr). The digital post processing step to determine this frequency content can utilize any discrete Fourier Transform or Fast Fourier Transform algorithms or methods that are known as the state of the art. By consequence, the maximum detection frequency bandwidth (Bd) is equal to the maximum time delay ($\tau_{Dmax}$) multiplied by the chirp rate, i.e., Bd $=\gamma * \tau_{Dmax}$.

Figure 2:
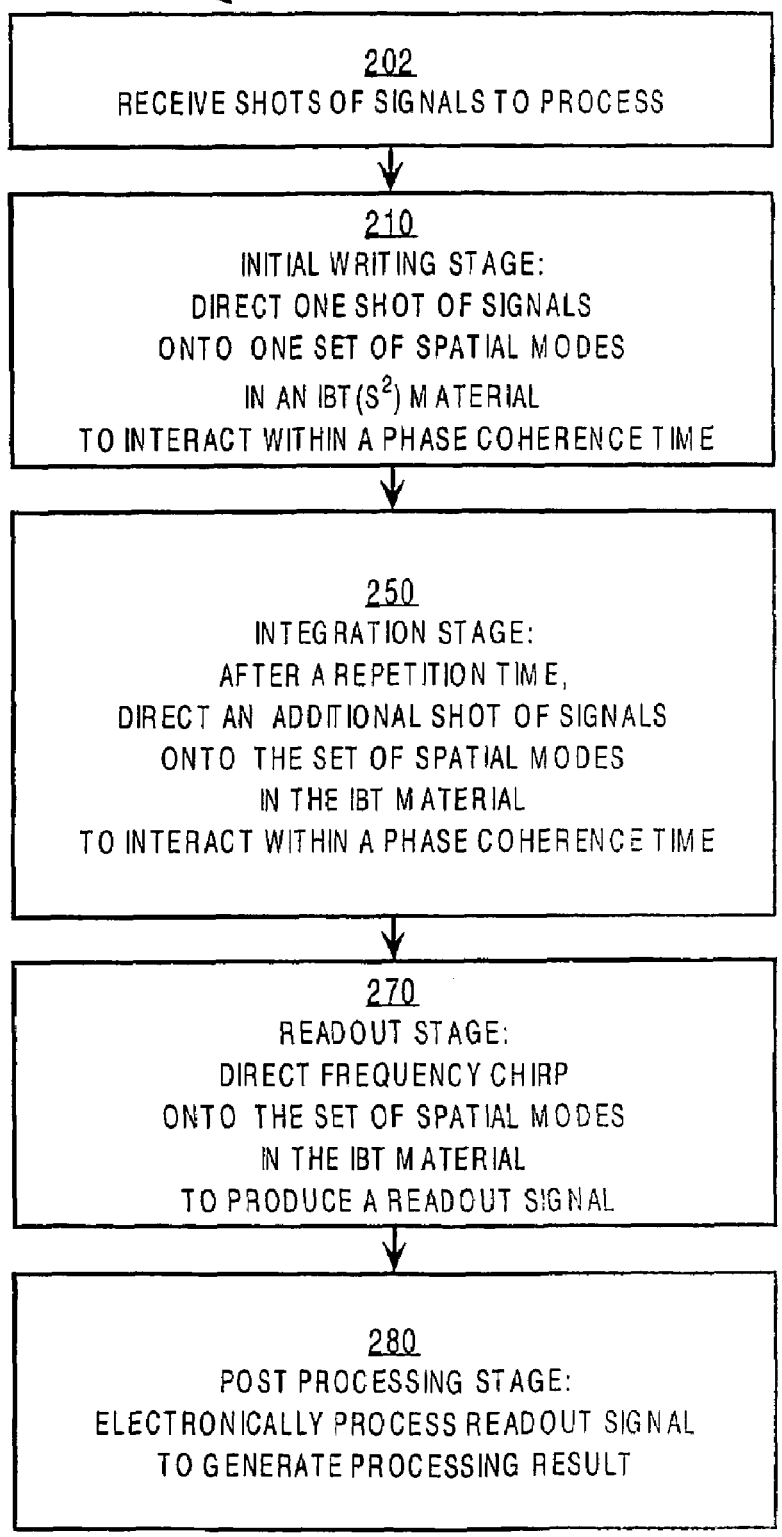
FIG. 2 is a flow diagram that illustrates at a high level a method for processing high TBP signals using an IBT material, according to an embodiment.

FIG. 2 is a flow diagram that illustrates at a high level a method for processing high TBP, large dynamic range signals using an IBT material, according to an embodiment. Although the steps are shown in a particular order for the purpose of explanation, in other embodiments, the steps may be performed in a different order or overlap in time or a step may be omitted. For example, the step 202 of receiving the shots can overlap in time the step 210 of writing the initial shot into the material; and the step 270 of the readout stage may occur continuously and simultaneously with the step 250 of the integration stage.

In step 202, a set of one or more shots, each of two or more signals to process, are received. The shots received in step 202 include all shots that are to be integrated in the processing. The first shot may be processed in the following steps while later shots are being received in step 202. In other embodiments, each shot includes only one signal.

Step 210 represents an initial writing stage. After a time on the order of one or more population recovery times from any previous processing steps, the signals in the first shot are directed to a set of one or more spatial modes in an LBT material within a time that, in some embodiments, is on the order of the phase coherence time T2. If array processing is performed with the signals of these shots, some or all of the signals, modified or not, are directed to different spatial modes of the IBT material during step 210. For example, different phase shifted replicas of a transmitted RADAR signal are directed to different parts of the material, each with a replica of the received RADAR signal.

Step 250 represents an integration stage. In the illustrated embodiment, in step 250, at a time $\tau_R$ that is on the order of the phase coherence time T2 after the immediately previous shot of signals was directed to the material, signals from a subsequent shot are directed to the material along the same spatial modes as used in step 210. All signals in the shot are directed to the same spatial modes. Step 250 is repeated for all shots to be integrated after the initial shot.

Step 270 represents a readout stage. Step 270 may be performed at any time during or after step 210 and repeated as often as desired. Readouts performed past the population recovery time TG after the first shot is written in the material do not include the effects of the first shot, so in the preferred embodiment, the readout of the first set of shots is performed before a time on the order of the population recovery time after the first shot is directed to the IBT material. The integrated result is obtained from step 270 after the last shot is directed onto the material and before the population recovery time after the initial shot. The resultant readout signal of step 270 is a temporal map of the integrated interaction absorption spectrum recorded in the material. If array processing is used, an array of readout signals is produced.

In the preferred embodiment, the readout is performed with a frequency chirped optical signal that sweeps the used frequencies of the inhomogeneously broadened absorption spectrum slowly enough to measure absorption features of interest to create a low bandwidth optical signal that can be well measured with low bandwidth high quality detectors and ADCs. If the frequency chirped optical signal is of low enough intensity, then it does no appreciably change to the spectrum (i.e., is non-destructive).

Step 280 represents a post processing stage. In step 280, the readout signal is processed to determine a processing result. For example, the digital Fourier transforms of the digital readout signals are computed to generate digital correlation on curves associated with each of multiple frequency shifts in different spatial modes. In some embodiments, the multiple correlation curves are output to generate a two dimensional range-Doppler ambiguity function. For a single target, in some embodiments, the correlation curve with the largest peak is determined, and the peak of that curve is used to derive a delay or range, and the frequency shift associated with that curve is used to derive a Doppler shift. In some embodiments, many such peaks are detected. In some embodiments, the post processor interpolates to a Doppler shift based on the peak amplitudes and associated frequency shifts of several correlation curves.

Using the method 200, high bandwidth, analog, large TBP signals with large dynamic range can be processed in the IBT material, and the results can be readout with high quality low bandwidth detectors and digitizers.

9. Optical Analog Device

Figure 3A:
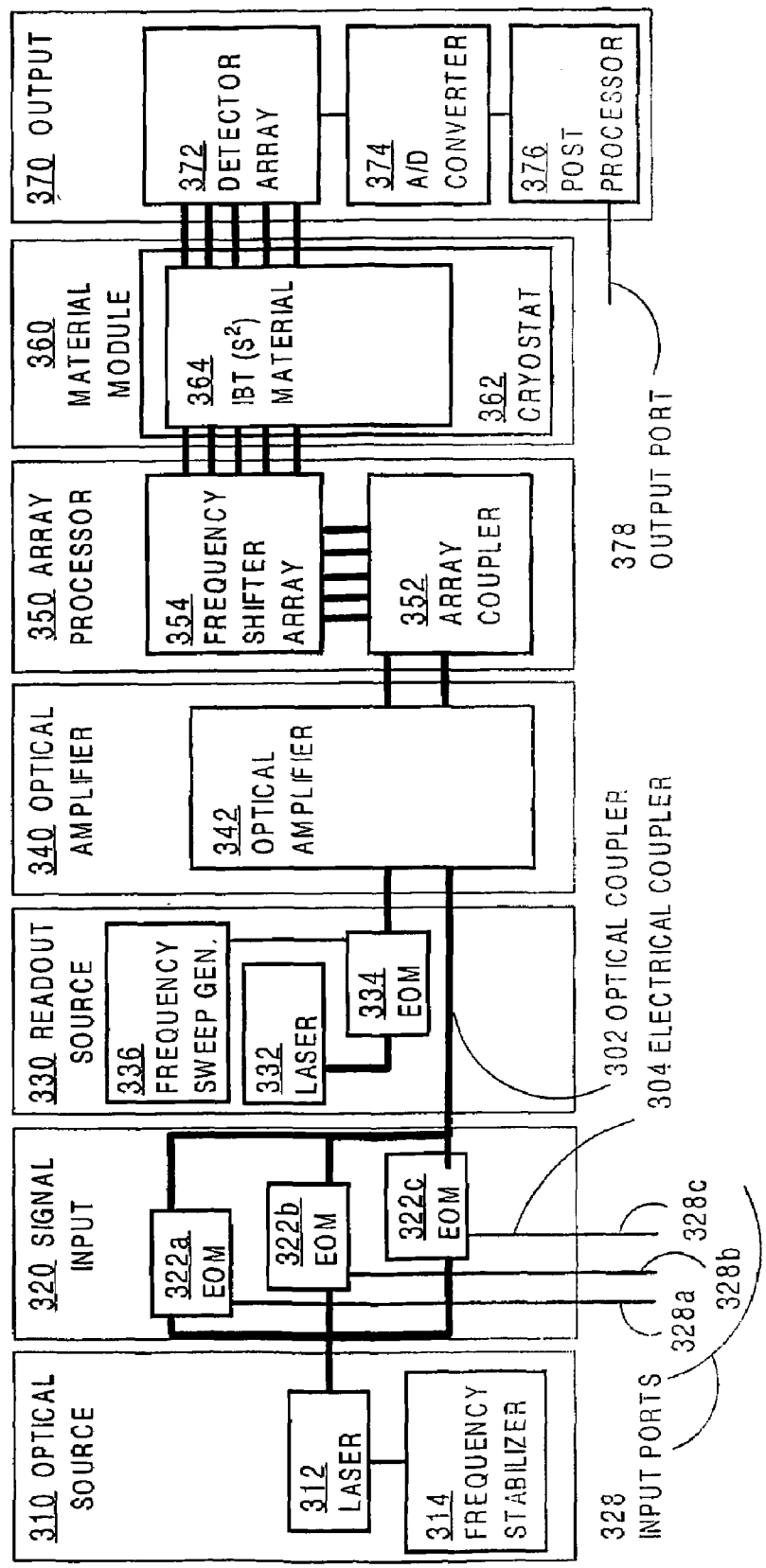
FIG. 3A is a block diagram that illustrates an optical analog processor, according to an embodiment.

FIG. 3A is a block diagram that illustrates an optical analog device 300, according to an embodiment. The optical analog device 300 includes an optical source module 310, a signal input module 320, a readout source module 330, an optical amplifier module 340, an array processor module 350, a $S^2$ material module 360, and an output module 370. In other embodiments, more or fewer modules may be included.

The modules are connected by optical couplers 302 represented in FIG. 3A by thick solid lines. Input ports 328 to the signal input module 320 and output ports 378 from the output module 370 are electrical couplers 304, such as wire and coaxial cable, represented by thin solid lines. In other embodiments, input ports or output ports, or both may include one or more optical couplers or wireless radio couplers or both. Various components in the modules are also shown connected by electrical couplers 304 in the illustrated embodiment.

9.1 Optical Source

The optical source is selected to have a frequency $f0=\omega 0/2\pi$ in the band of the inhomogeneously broadened absorption spectrum 120 and to be stabilized so that frequency fluctuations are smaller than the homogeneously broadened absorption line bandwidth (~1/T2) during the lifetime of the spectrum (TG). As such, a frequency-stable laser acts as the optical master oscillator for the device. The laser/master oscillator stability is an important device parameter, as the frequency characteristics of the master optical oscillator affect the overall coherent processing performance. As stated above, this line bandwidth should be as narrow and stable as possible over the desired integration time, and certain stability is demanded to generate processing results that are coherent and can thus be integrated over the integration time. The value ($\sim 1/(100^* \tau_{Dmax})$) is a general guideline for large dynamic range processing; for example, to resolve delays of 1 µs, stability of 10 kHz would be required. In the illustrated embodiment, the optical source module 310 includes a laser 312 controlled by an electrical connection to a frequency stabilizer component 314.

To perform the integration of a spectral population grating, the requirement exists that the phase difference between the optical carriers carrying the interacting pulses be relatively constant over the integration time. For example, if the carrier frequency changes to $\omega 0 + \delta \omega 0$ between two carriers for two interacting signals, then a change in the phase difference ($\delta \phi$) between two interacting pulses, 1 and 2, results—with a value of $\delta \phi 21 = \delta \omega 0^* \tau_D$, where $\tau_D$ is the delay between the two interacting pulses and $\phi$ represents phase. This phase difference should be relatively constant over the integration time. That is $$\delta \phi 21_k - \delta \phi 21_j << \pi \quad (3a)$$

between any shots k and j of interacting pulses within time TG. This implies that the short term frequency stability of the source should be better than $$\delta \omega 0 << \pi / \tau_D \quad (3b)$$

over any time period within TG. When the same optical source (or a group of multiple, locked sources) is used to generate both interacting optical beams, then the long-term frequency drift of the center frequency is inconsequential, provided all optical signals of interest stay well within $\delta \omega I$.

In some embodiments, the laser 312, or the frequency stabilizer component 314, or both, are controlled by an electronic processor that is either internal to or remote from the device 300, or both. An electronic processor is described in more detail in Section 12.

In some embodiments, the laser 312 is an external cavity diode laser (ECDL) master oscillator based on the Littman-Metcalf cavity configuration well known in the art. These devices are commercially available (e.g., from New Focus Inc. of San Jose, Calif., USA). These commercial lasers have appropriate specifications on poster ($\sim$100 milliW, mW, 1 mW=$10^{-3}$ W), tunability ($\sim$100 GHz mode-hop-free) and spatial mode. The frequency stability of the commercial lasers is specified to $\sim$300 kHz on a 10 milliseconds (ms, 1 ms=$10^{-3}$ s) time frame. However, the required level of frequency stability is not currently available from commercial units. An extra frequency stabilizing component 314 is included in the illustrated embodiment.

In some embodiments, the frequency stabilization component 314 uses the EBT material as a reference, based on techniques described, for example, in U.S. Pat. No. 6,516,014, the entire contents of which are hereby incorporated by reference as if fully set forth herein. The frequency locking techniques utilize transient, regenerated spectral holes in the IBT material burned by the continuous wave (cw) optical oscillator. Active stabilization is achieved using a Pound-Drever-Hall technique, where an error signal is derived in stabilizer 314 from the deviation of the carrier instantaneous frequency to the spectral hole burned earlier by the carrier. This error signal is negatively fed back to a diode current control input on laser 312 in real time to achieve active frequency stabilization. This approach is inherently compatible with optical device 300 using the IBT ($S^2$) material module described in more detail below. A different spatial mode in the IBT material may be used to burn the spectral hole. No additional cryogenic equipment is needed to support this technique to stabilize laser 312. Using this technique, the best performance of ECDL stabilization has been specified to 20 Hz root-Allen deviation over 10 ms in an IBT material composed of Tm:YAG (0.1 at. %) at 1.9K—a dramatic 2 parts in $10^{13}$ of frequency stability (N. M. Strickland, P. B. Sellin, Y. Sun, J. L. Carlsten, and R. L. Cone, Physics Review B Vol 62, 2000, p. 1473). A laser frequency stability of 1 kHz over 10 ms is achievable based on locking to Tm:YAG (0.1 at. %) at 4K.

In one embodiment, the frequency stabilizer component 314 includes several commercial off-the-shelf components, such as electro-optic modulators (EOM), photo-detectors, and radio frequency (RF) oscillators and mixers In the illustrated embodiment, the frequency-stabilized laser 312 generates an optical carrier at frequency f0 that is used in subsequent modules. Therefore laser 312 directs the optical carrier onto an optical coupler 302 for delivery to the signal input module 320.

9.2 Signal Input

Signal input module 320 includes multiple input ports 328, such as input ports 328a, 328b, 328c. Each input port 328 is electrically connected to an electro-optic modulator (EOM), such as EOM 322a, 322b, 322c, respectively, collectively referenced hereinafter as EOM 322. Although three input ports with corresponding EOM are shown in FIG. 3A, in other embodiments, more or fewer input ports and EOM may be used.

Each EOM is connected to the optical source 310 through an optical coupler that brings the optical carrier beam with frequency f0. The output of each EOM is a modulated optical beam, or modulated optical signal, which is directed through an optical coupler to the IBT material, through any intervening modules. The modulated optical signal from each EOM 322 is based on the optical carrier and the signal input on the input port 328 connected to the EOM 322. In some embodiments, electro-optic phase modulators (EOPMs) are used to modulate the optical carrier in phase in proportion to the sign and magnitude of the applied RF voltage.

In some embodiments, the EOM 322, or other components, or both, are controlled by an electronic processor that is either internal to or remote from the device 300, or both.

Electro-optic conversion of RF signals onto the optical carrier in some embodiments is achieved using high bandwidth waveguide EOMs. These components are commercially available for operation at wavelengths from 780 nanometers (nm, 1 nm=$10^{-9}$ meters) to 1600 nm. These wavelengths correspond to optical frequencies from 385 THz to 188 THz. Use of these high quality devices (and the associated electronics to drive them) has become widespread due to their deployment in telecommunications systems. For example, appropriate EOMs are commercially available from EO-Space Inc. of Redmond, Wash., USA. An embodiment of device 300 tailored for RADAR processing utilizes two of these devices per antenna element.

In the RADAR example, both the RADAR reference signal (a replica of the transmitted waveform) and return signals (an attenuated version of the transmitted waveform, buried in noise and Doppler shifted) are modulated onto an optical carrier, each on an independent EOM.

The performance of the signal input module is determined by the frequency response, linearity and additive noise of the components utilized to build the module. In some embodiments, a RF amplifier is included between the input ports and the corresponding EOM. Appropriate RF amplifiers are commercially available from many vendors (e.g., Agilent, Palo Alto, Calif., USA and Picosecond Pulse Labs of Boulder, Colo. USA).

9.3 Readout Source

The readout source 330 provides a slow frequency chirped pulse to read the interaction absorption spectrum recorded along each spatial mode in the IBT material. In the illustrated embodiment, the readout source 330 includes a laser 332 and an optical modulator such as EOM 334 electrically controlled by an RF frequency sweep generator 336. The optical carrier signal output by the laser 332 is input through an optical coupler into the modulator, e.g. EOM 334 where it is modified according to the electrical signals from frequency sweep generator 336. The output is the slow frequency chirp on the optical coupler directed to the next module, the optical amplifier module 340. In other embodiments, other sources for a slow frequency chirp are used. Direct digital synthesis of RF frequency sweeps at 1 Gs/s are commercially available from Analog Devices of Norwood, Mass., USA, for example model number AD9858. Any method known in the art at the time the optical device is made may be used. In some embodiments the laser 332 is replaced by an optical coupler to the optical source 310 laser 312.

In some embodiments, the laser 332, or the modulator, (e.g., EOM 334) or the sweep generator 336, or some combination, are controlled by an electronic processor that is either internal to or remote from the device 300, or both.

In the illustrated embodiment, the readout module creates a single sideband, suppressed carrier (SSB-SC) tone or carrier frequency that sweeps (or chirps) over the readout bandwidth Br of interest within the frequency band $B_M$ of the inhomogeneously broadened absorption spectrum 120. For example, an acousto-optic modulator (inherently SSB-SC) is being used in the demonstration described below in Section 11. In other embodiments, other sidebands may be present that do not appreciably interfere with obtaining the readout signal in the band Br that may be only a portion of the material bandwidth $B_M$.

In a preferred embodiment, the critical performance specifications of SSB-SC modules are linearity of chirp, phase noise, amplitude noise, carrier suppression and sideband cancellation, such that these do not limit the device dynamic range.

In some embodiments, the laser 332 is a second slave oscillator, frequency agile and offset from the master oscillator. This slave ECDL is referenced and locked to the master ECDL, and may have the capability to discretely tuned to readout various portions of the spectral population grating.

9.4 Optical Amplifier

The optical amplifier module 340 includes one or more optical amplifiers, such as optical amplifier 342. The broadband modulated optical signals from the signal input module 320 are amplified to achieve intensities needed to record appreciable spectra in the IBT material. The modulated optical signals from the readout source module 330 are amplified to detect transmission through the IBT material. The two optical couplers entering and exiting the optical amplifier 342 carry the slow frequency chirped pulse from the readout source module 330 and the modulated optical signals from the signal input module 320, respectively.

In some embodiments, the optical amplifiers in module 340 are controlled by an electronic processor that is either internal to or remote from the device 300, or both.

Any optical amplifier known in the art with appropriate characteristics at the time the optical processor is built may be used. Several optical amplifier approaches exist and depend on the optical wavelength of operation. At 1550 nm, 194 THz, Erbium doped fiber amplifier (EDFA) components are a mature and widespread technology, and other approaches such as semiconductor optical amplifiers and Raman fiber amplifiers are also reaching maturity. At present time, near 800 nm, 375 THz, amplifier technology is evolving with applications and market demand. Several approaches are possible, including tapered waveguide semiconductor optical amplifiers (SOAs), injection locking to high powered diode lasers, and fiber amplifiers. In addition, both thulium doped fiber amplifiers and Raman fiber amplifiers are evolving technology for 793 nm.

9.5 Array Processor

The array processor module 350 includes an array coupler 352 to combine modulated optical signals associated with one shot into multiple spatial modes through the IBT material for array processing. The array coupler 352 shows multiple optical couplers emerging for each optical coupler entering from optical amplifier 342. Any method known in the art may be used to direct optical signals into the desired spatial modes, including replicating one or more signals. The array coupler also replicates the slow frequency chirped pulse and directs any replicas, at least as needed, onto multiple spatial modes. The number of spatial modes and the modifications to the optical signals, if any, performed in the array processor module 350 depends on the processing to be performed. It is well within ordinary skill in the art to dispose lenses, mirrors, beam splitters, phase shifters, and other devices to direct one or more input optical signals on one or more optical couplers into one or more output optical couplers or focus those beams on an image plane of the IBT material.

In the illustrated embodiment, Doppler shift detection is to be performed, so the array coupler sends signals to a frequency shifter array 354 to frequency shift some signals before directing them onto spatial modes through the IBT material.

The array processor module 350 combines the aspects of spatial multiplexing to create a bank of parallel processing operations. In some embodiments more or fewer components are included in the array processor 350, or the array processor module is omitted altogether, and only one spatial mode is used in the device 300 for recording and reading absorption spectra.

In some embodiments, the array coupler, or the frequency shifter array, or both, are controlled by an electronic processor that is either internal to or remote from the device 300, or both.

The frequency shifter array 354 can be achieved by any method known in the art. In one embodiment, a tilting mirror is illuminated normally and imaged accordingly. In other embodiments, the mirror may be illuminated at a different angle. At the axis of tilting in the center of the mirror, no Doppler is produced, while on one side the mirror moves towards the beam and Doppler upshifts are produced that get larger as the distance away from the tilting axis increases. Similarly on the other side, the mirror appears to be moving away with a corresponding Doppler downshift that linearly increases as the distance away from the axis increases. This embodiment may suffer from mechanical instabilities and precision issues that acousto-optic approaches with no moving parts would not have.

A more reliable, straightforward approach is to create an array of beams and to use an array of acousto-optic frequency shifters (AOFS), one on each beam. Each of the AOFS devices would modulate the input light at a center frequency with a corresponding offset frequency shift, for example, one device at frequency $f_1$, the next at $f_1+\delta$, the next at $f_1+2\delta$, and so on. This approach has no technical holdups, but suffers from needing a AOFS and RF driver for each spatial mode.

Other embodiments use two acousto-optic modulators instead of an array of frequency shifters to achieve similar results. In an illustrated embodiment, two commercially available acousto-optic devices (AODs) are disposed in a counter propagating RF wave propagation geometry, and each driven by the same slow RF chirp. Counter propagating AOD geometries have been employed previously for optical processing application ("Acousto-optic time integrating frequency scanning correlator" N. J. Berg, I. J. Abramovitz, M. W. Casseday, J. N. Lee, U.S. Pat. No. 4,421,388). FIG. 3B is a block diagram that illustrates an embodiment 350*a* of frequency array processor 350. Component 350*a* includes two AODs 381*a*, 381*b* each fed by a corresponding chirp generator 382*a*, 382*b*, respectively. In some embodiments, generators 382*a*, 382*b* are the same. With one AOD reverse imaged onto the other, and operated in conjugate orders, this assembly can be used to produce a spatial array of frequency-shifted optical reference beams. This can be programmed to produce the required array of frequency shifts 389 by driving input of the AOD with an appropriate RF chirp. The resulting frequency shifts vary linearly over a device aperture up to a maximum which can cover a nominal frequency range of 10 kHz in 10 ms by choosing the chirp rate as 1 MHz/µs. The RF frequency chirp for the Doppler module can be created in generators 382*a*, 382*b* with a chip that performs direct digital synthesis of low bandwidth analog waveforms (DDS chip) and controller, in some embodiments.

In another embodiment, one acousto-optic device is used. The device is driven in a first direction by a slow RF chirp. In this embodiment, an array of beams output by the device are directed back through the same device driven by the same slow RF chirp, but in a direction that is opposite to the first direction relative to the direction of propagation of the beams.

The operation of these embodiments can be interpreted as a pair of controller propagating moving lenses whose quadratic phase factor cancels out leaving a linear time varying prismatic phase factor just as in the case of the linearly tilting mirror. Alternatively, it can be interpreted as an implementation of the well-known symmetric chirp algorithm, producing an array of Doppler shifted beams to be used for parallel array Doppler processing.

By modulating the reference beam first with the signal of interest, amplifying and creating a spatial array, and then feeding this array of signals to an spatial array frequency shifting device, each spatial mode has the information of the reference and a corresponding desired frequency shift.

9.6 Material Module

The material module 360 includes an IBT material 364 (also called an $S^2$ material) maintained at cryogenic temperatures in a cryostat 362 with optical windows for passing optical signals into the material.

Scientific Materials Corporation (SMC) of Bozeman, Mont. is currently the sole supplier of high purity rare-earth-doped spatial-spectral crystalline materials used in the illustrated embodiments. Materials currently exist with desirable homogeneously broadened line widths and inhomogeneously broadened absorption bandwidths. Two candidate materials have properties suitable to demonstrate processing of RADAR signals. The first material is yttrium aluminum garnet ($Y_3Al_5O_{12}$) doped with thulium (represented by the symbol Tm:YAG); the second material is yttrium silicate ($Y_2SiO_5$) doped with erbium (represented by the symbol Er:YSO).

TABLE 1

Properties of two typical IBT materials.

| Property \ Material > | Tm:YAG | Er:YSO |
| --- | --- | --- |
| Wavelength | 793.375 nm | 1536.140 nm |
| Center frequency | 377.86500 THz | 195.15800 THz |
| Rare-Earth dopant | thulium | erbium |
| Concentration | varies (e.g., 0.1 at. %) | varies (e.g., 0.001 at. %) |
| Bandwidth | ~20 GHz | ~0.5 GHz (variable to 20 GHz in other hosts) |
| Linewidth (1/T2) | varies (<200 kHz) | varies (<200 kHz) |
| Ratio (~TBP) | varies (>1000) | varies (>1000) |
| Population decay time (TG) | ~10 ms | ~10 ms |

The IBT materials typically require cooling to cryogenic temperatures for operation. The illustrated embodiment calls for cooling to the 4K to 5K level. Optical absorption contributes to local heating in the materials that needs to be cooled. Present day, reliable, turnkey, maintenance-free for 20,000 hours and low vibration, closed cycle cryo-coolers are commercially available for 1.0 W of cooling power at 4K (Cryomech Corp. of Syracuse, N.Y. USA). These systems are finding widespread deployment in magnetic resonance imaging systems and are improving in cost and efficiency. Current specifications of vibration levels are 10 µm (microns, 1 micron=$10^{-6}$ m) on the 1.4 Hz scale, which is within the displacement tolerance for spatial modes over the 10 ms integration time scale. Industrial efforts to dampen the small vibrations to 1 µm displacement continue.

In some embodiments, the cryostat (cryo-cooler) is controlled by an electronic processor that is either internal to or remote from the device 300, or both.

The signal to noise ratio (SNR) of spectra recorded in the IBT material, or the dynamic range, or both, ultimately depends on the absorbing ions per spectral channel, given the absorbers available in a volume associated with each spatial mode. A parameter $\Gamma$ representing the material absorbers per unit bandwidth per unit volume (e.g., ions/(Hz $m^3$)) is derived from a doping density and host. For example, for Tm:YAG (0.1 at %) with a 20 GHz bandwidth, $\Gamma=7\times10^{14}$ ions/(Hz $m^3$). A collinear spatial mode, used by interacting beams, which has a diameter of 50 µm through a crystal 5 mm (millimeter, 1 mm=$10^{-3}$ m) long, has an interaction volume of $10^{-11}$ $m^3$. In such a volume of Tm:YAG (0.1 at %) there are 7000 ions per Hz; and, therefore, there are on the order of $10^9$ ions in the spatial mode per spectral channel (one homogeneous broadened line) of about 150 kHz linewidth. Thus there is a potentially great dynamic range for absorption spectral amplitudes in these materials.

9.7 Output Module

The output module 370 includes an O/E photo-detector array 372 connected by electrical coupler to an ADC 374, which is connected by electrical coupler to post processor 376. In some embodiments, the post processor may be omitted. In some embodiments that use a single spatial mode, a single detector is used in place of detector array 372.

In some embodiments, the detector array 372, or the converter 374, or post processor 376, or some combination, are controlled by an electronic processor that is either internal to or remote from the device 300, or both.

The readout technique of device 300 achieves a low bandwidth representation of the result of high bandwidth signal processing. Consequently, tremendous advantages in the comparative noise equivalent power (NEP) and dynamic range for a low bandwidth (~1 MHz) detector over higher bandwidth (1-10 GHz) photo-detectors can be exploited.

In some embodiments, a detector in the photo-detector array 372 utilizes certain well-known photo-detection circuits that cancel the effects of laser intensity noise by several orders of magnitude, making very small signal variations on a large background easy to detect, yielding performance that is close to being limited by shot noise. This approach is well suited for the readout techniques and increasing the backend dynamic range. The second purpose in the utilization of such intensity noise canceling detectors is that proper design of the bandwidth of the detector will remove the effects of the intensity variation of the chirped laser from the grating readout.

Following detection, the signal undergoes an analog-to-digital conversion prior to post processing. Here again the device 300 has the advantage of not requiring high bandwidth ADCs for post processing of high bandwidth wave forms. For example, at the time of this writing, a 16-bit ADC at 20 Megasamples per second, AD9260, is available from Analog Devices of Norwood, Mass. for under $50. For high bandwidth sampling, an 8-bit ADC at 20 Gs/s (in Tektronix scope TDS7000, from Tektronix, Inc of Beaverton, Oreg., United States.) is available for a price that is about three orders of magnitude greater than the AD9260.

10. RADAR Processing System

Figure 4:
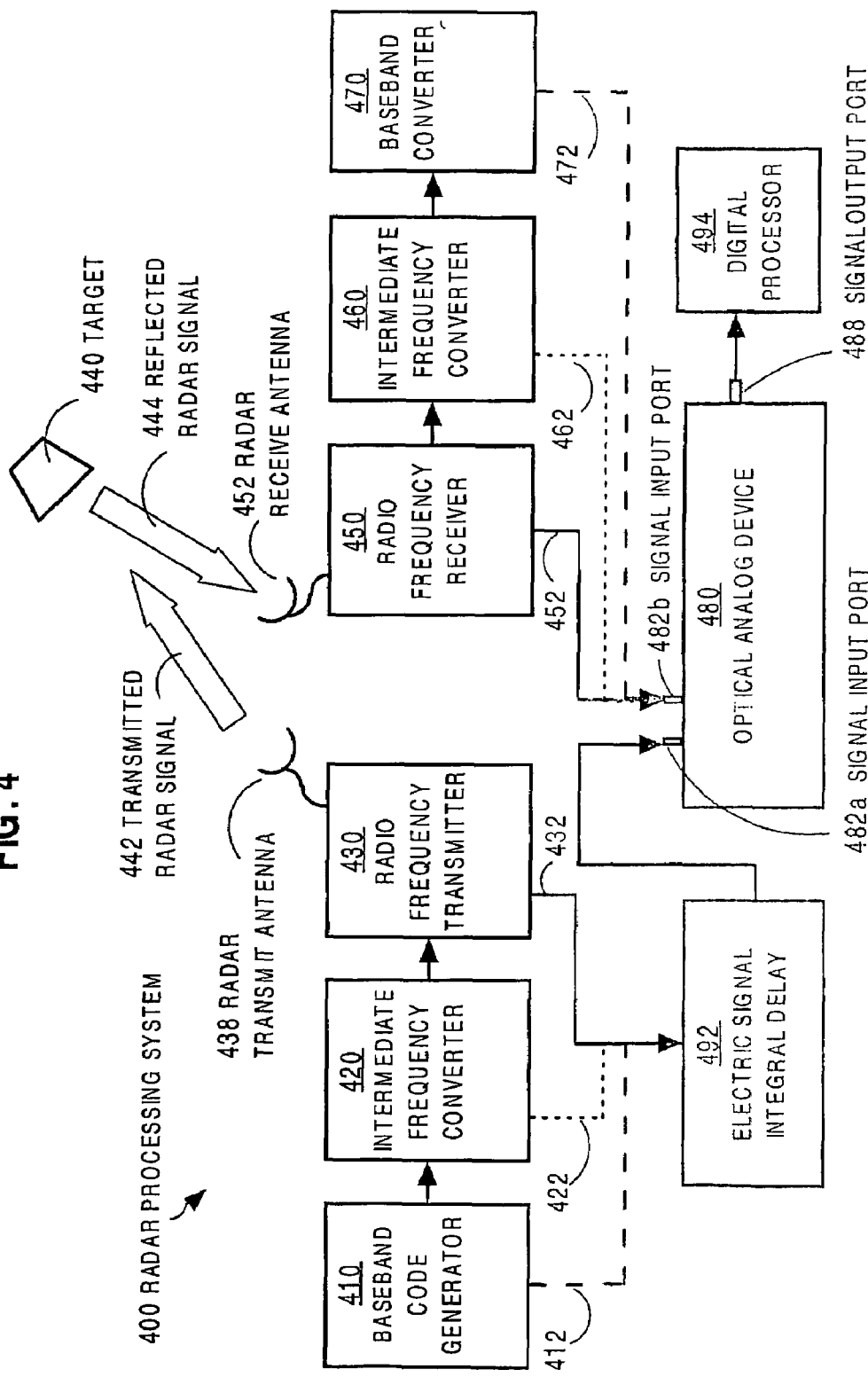
FIG. 4 is a block diagram that illustrates a RADAR processing system that uses an optical analog processor, according to an embodiment.

FIG. 4 is a block diagram that illustrates a RADAR processing system 400 that uses an optical analog device 480, according to an embodiment. A conventional RADAR system includes a radio frequency transmitter 430 electrically connected to a RADAR transmit antenna 438, and a RADAR receive antenna 452 electrically connected to a radio frequency receiver 450. In some embodiments, the transmit and receive antennae are the same. A RADAR transmitted signal 442 is transmitted from the RADAR transmit antenna and impinges on a target 440, which may be moving. One or more surfaces on the target 440 reflect the transmitted signal as a reflected RADAR signal 444 that is received by the RADAR receive antenna 452. The transmit and received waveforms are sent to a digital processor, such as digital processor 494 to determine the range to and speed of target 440.

A conventional RADAR system commonly generates the signal transmitted by radio frequency transmitter 430 in a baseband code generator 410 and an intermediate frequency converter 420. The baseband code generator generates the bits or chips that make up the code to be transmitted. The signal may be as simple as a voltage that changes at the bit rate, usually much less than 10 GHz. In sophisticated systems the baseband code generator generates a different code for each transmitted pulse to hinder the ability of the target to detect the transmitted RADAR signal 442, enhance the security of the RADAR system, and reduce sidelobe contributions. The baseband code can be used to modulate radio frequency transmissions directly, which are often in frequencies at or above 1 GHz, using a RF mixer or mixers. However, in many systems the code is mixed with an intermediate frequency (IF) electronic signal in an IF converter 420, and the IF signal is used to modulate the RF carrier, for example with binary phase shift keying (BPSK).

Similarly, a conventional RADAR system commonly decodes the reflected signal (including delays, Doppler frequency shifts and noise) received by radio frequency receiver 450 in an intermediate frequency converter 460 and a baseband code converter 470. The IF converter 460 steps the radio carrier frequency down from the GHz range to the lower frequencies. The baseband converter 570 generator generates the bits or chips that make up the received signal. The baseband received signal may be as simple as a voltage that changes at the bit rate.

According to the illustrated embodiment, signals from the RADAR system are input to an optical analog device 480 at signal input ports 482a, 482b (collectively referenced hereinafter as signal input ports 482). The optical analog device 480 is an embodiment of the optical analog device 300 depicted in FIG. 3, configured for RADAR signal processing, either by internal controllers or external controllers such as digital processor 494 or by internal hardwired components. The optical analog device 480 processes the signals input at input ports 482, and generates an output signal at output port 488. The output signal is used directly in some embodiments. In the illustrated embodiment, the output signal is used as input to a digital processor 494, such as a computer, which displays or further processes the output signal.

In some embodiments, some signals from the RADAR system are first input to an electric signal integral delay device 492 before being passed to the optical analog device 380. The electric signal integral delay device 492 is described in more detail below. If the electric signal integral delay device 492 is omitted, the signals depicted as input to the delay device 492 are instead input directly to the input port 482a of optical analog device 480.

The optical analog device can process multiple shots of signals. Each shot includes a pair of signals: a reference signal that represents the signal transmitted by the RADAR system; and a return signal that represents the reflected RADAR signal received by the RADAR system. The processing by the optical analog device 480 can be performed either in a configuration where the reference signal and return signal are at baseband bit rates, or at an IF carrier modulated versions of the baseband signal, or at the RADAR frequency transmitted and reflected pulses, for example, depending oil the performance of the electro-optical modulators 322. If the baseband bit rates are used as the input signals, then a baseband reference signal is communicated to input port 482a of the optical analog device 480 through electrical coupler 412 (and electrical signal integral delay 492, if present); and a baseband return signal is communicated to input port 482b of the optical analog device 480 through electrical coupler 472. If the IF frequency signals are used as the input signals, then an IF reference signal is communicated to input port 482a of the optical analog device 480 through electrical coupler 422 (and electrical signal integral delay 492, if present); and an IF return signal is communicated to input port 482b of the optical analog device 480 through electrical coupler 462. If the radio frequency signals are used as the input signals, then a radio reference signal is communicated to input port 482a of the optical analog device 480 through electrical coupler 432 (and electrical signal integral delay 492, if present); and a radio return signal is communicated to input port 482b of the optical analog device 480 through electrical coupler 452.

In the illustrated embodiment, the optical analog device 480 provides precision delay measurements with delay resolutions that correspond to fine range resolution, e.g., a range resolution of centimeters, up to a maximum delay that corresponds to a maximum range, e.g., a few hundred meters. To determine precision delay measurements at longer ranges, the reference signal can be delayed a known amount, until the remaining delay is within the maximum delay detected by optical analog device 480. This is accomplished in electrical signal integral delay device 492. For example, the reference signal can be routed through a length of cable that is known to be a certain length longer than the length of cable from the return signal (the integral delay) or routed a certain number of times through a loop of known length (an integral delay) to produce an integral number of fixed delays (the integral delay).

In some embodiments, the output of the optical analog processing device 480 is a digital signal that represents the absorption measurements. In some embodiments, a processor within the optical analog device 480 (e.g., post processor 376 in FIG. 3) preconditions the readout signal as needed and extracts the relevant content of the mapped interaction absorption spectrum. In some embodiments, a processor within the optical analog device 480 performs analysis on the set of readout signals corresponding to the set of frequency-shifted reference pulses to determine the delay-Doppler profile. In some embodiments, the internal processor also takes the Fourier transform of the spectra. In some embodiments, the internal processor also generates the cross correlation curves, and determines the best peak, the associated Doppler shift and delay, and the corresponding range, or some combination of these results.

In any embodiment, the digital processor 494, if present, does any processing needed to convert from the output of the optical analog device 480 to the desired processing result. In various embodiments, the processing result is used in any way deemed beneficial for the RADAR processing system, including the generation of new baseband codes.

11 Use of RADAR Processing System

In RADAR range and Doppler processing applications, a complex RF pulse sequence is transmitted. The delayed received signal is analog in nature, attenuated, with extra noise, frequency shifted by an amount related to the velocity of the target, and with reflections combined from possibly multiple surfaces. Correlation between the transmitted and return signals yields the round-trip time for the RADAR pulse as a delay $\tau_D$. When the reference and return signals are modulated on the same optical carrier in optical analog device 480, the IBT records their spectral interference with a modulation period $1/\tau_D$. Thus $\tau_D$ is derived from the spectra recorded in the IBT material.

The RADAR system should process pulses of duration Tp and bandwidth Bp. The optical analog device 480 limits Bp to be less than or on the order of the bandwidth $B_M$ (also represented by the symbol $\delta\omega_I$) of the inhomogeneously broadened absorption spectrum in the IBT material. Similarly, the device 480 limits the coherently processed pulse duration Tp to be on the order of the phase coherence time. T2; and limits an integration time Ti to be on the order of the population recovery time, TG.

The pulses are repeated at a pulse repetition frequency (PRF) with a corresponding pulse repetition interval $\tau_R = 1/$PRF. Integration of N coherent spectral interactions theoretically increases the intensity of the main frequency component $(1/\tau_D)$ by $N^2$, while the noise grows more slowly, with the first power of N. The integration also provides resolution for frequency analysis of return signals to determine any Doppler shifts. The main frequency component $(1/\tau_D)$ is the same no matter which coded waveform is used as the transmitted signal; therefore agile codes can be used, changing the codes from shot to shot. The codes can be selected to have zero mean, and a large number of such zero mean codes has at least two advantages. First, they increase the security of the RADAR system. Second, they increase the processing gain through distributed spread spectrum techniques, thus increasing the overall ratio of integrated; peak root mean square (rms) value to the rms of sidelobes.

In practice, the intensity of the main frequency component grows at slightly less than $N^2$ and is modeled as $N^{2\alpha}$, where $\alpha$ is a coefficient such that $0 < \alpha \leq 1$, until a compression point is reached where the material begins to saturate and run out of ground state absorbers to record the interaction. In addition to the main component at $(1/\tau_D)$, there are other cross terms, or "spurs," that record harmonics of each single delay and "intermods" from two or more delays in each shot. When these spurs grow larger than the noise floor, they limit the dynamic range of the recorded spectrum. The overall device performance will be an optimization of signal strength and dynamic range.

For Doppler processing, frequency-shifted reference signals are directed to parallel spatial modes as narrow-band Doppler filters. Doppler shifts of interest are typically in the range of 100 Hz to 100 kHz. Such shifts can be produced by the AODs described above. In this technique, the RF reference signal is modulated onto the optical carrier beam and then subsequently diffracted by counter propagating AODs that create spatially separated frequency offset versions of the reference that are imaged onto the IBT material, as described above. Over multiple shots, the cumulative phase difference for unmatched frequency shifted references causes the grating to wash out at the corresponding spatial modes. At the same time, the closely matched frequency shifted references that match the Doppler shift in the return pulse accumulate a strong grating in its corresponding spatial mode. All spatial modes can be read out to produce a complete range-frequency shift data set in which the proper frequency shift demonstrates the greatest amplitude in the main frequency component $(1/\tau_D)$.

The properties of the readout stage depend on the maximum resolvable time delay $(\tau_{Dmax})$ and the chirp rate $\gamma$, as described above. The corresponding range bin of the processor is $R_{bin} = c^* \tau_{Dmax}/2$, where c is the speed of light. The fundamental limit on $\tau_{Dmax}$ is related to T2, the phase coherence time. Several readout properties can be defined as follows:

| Readout bandwidth (Br) | Br ≤ Bp |
|---|---|
| Readout rate (γ) | γ = Br/Tr |
| Detection bandwidth (Bd) | Bd = γ * $\tau_{Dmax}$ |

Table 2 lists possible delays $(\tau_{Dmax})$ and their associated detector bandwidth (Bd) for varying values of $\gamma$.

TABLE 2

Example delays and associated detector bandwidth (Bd) in MHz.

| $\tau_{Dmax}$ (µs) | γ = 1 MHz/µs | γ = 2 MHz/µs | γ = 2.5 MHz/µs | γ = 4 MHz/µs | γ = 5 MHz/µs | γ = 10 MHz/µs |
|---|---|---|---|---|---|---|
| 1 | 1 | 2 | 2.5 | 4 | 5 | 10 |
| 2 | 2 | 4 | 5 | 8 | 10 | 20 |
| 2.5 | 2.5 | 5 | 6.25 | 10 | 12.5 | 25 |
| 4 | 4 | 8 | 10 | 16 | 20 | 40 |
| 5 | 5 | 10 | 12.5 | 20 | 25 | 50 |
| 10 | 10 | 20 | 25 | 40 | 50 | 100 |

Because delays longer than the longest delay bin can be handled by synchronizing the delay bin with front end electronics, e.g., in the electrical signal integral delay device 492 in FIG. 4, initial embodiments use short delay bins with small latency TL, high resolution, and large dynamic range.

An example RADAR system has a value for pulse repetition frequency (PRF) of 50 kHz and a value for pulse length Tp of 10 µs, and a pulse bandwidth Bp of about 1 GHz. A suitable IBT material would have a value for T2 of 10 µs and a bandwidth B of 1 to 10 GHz to process pulses with a TBP from 10,000 to 100,000 at each resolvable spatial mode through the material. PRF is limited by the time between shots.

The upper limit on the number of integrated shots Nmax is the integration time times the fastest PRF allowed by the IBT material. For example, for Ti of 10 ms and the maximum allowed PRF of 50 kHz, the maximum value for N is 500 shots.

In any RADAR, the delay resolution depends on the bandwidth and signal to noise ratio (SNR) of the received signal but is typically limited by the delay resolution of the processor itself. The delay resolution of the optical analog device 480 can be selected based on the readout bandwidth of the integrated interaction absorption spectrum recorded in the IBT material and the dynamic range based on the absorbers.

The Doppler resolution is ultimately related to the inverse of the integration time and the SNR. Thus, a Doppler resolution of about 100 Hz is achievable for Ti of 10 ms if the SNR is sufficiently high. A 100 Hz Doppler resolution corresponds to a velocity resolution that depends on the RADAR carrier frequency (e.g., for 15 GHz RF carrier frequency, velocity resolution is 1 meter per second for 100 Hz Doppler resolution). To exploit this resolution over a large range of Doppler shifts, to cover a large velocity range, a large number of frequency shifted reference signals are introduced on different spatial modes through the IBT material. The number of spatial modes is limited by the size of the crystal and the volume of resolvable spatial modes with sufficient dynamic range to record an interaction absorption spectrum. Finer Doppler resolution can be achieved by digital post processing.

12. Demonstration

Signal delay processing results have been generated for two demonstration embodiments, one embodiment at optical frequencies near 195 THz (1536 nm) (Z. Cole, T. Bottger, R. Krishna Mohan, R. Reibel, W. R. Babbitt, R. L. Cone and K. D. Merkel, Applied Physics Letters, 81, 3525), and the other embodiment at optical carrier frequencies near 378 THz (793 nm)("Demonstration of the Spatial-Spectral Coherent Holographic Integrating Processor (S2-CHIP) for Analog rf Signal-Processing Applications," K. D. Merkel, Z. Cole, R. K. Mohan, W. R. Babbitt, GOMACTech-03 Conference Proceedings, Paper 26.8, Tampa, Fla., Apr. 3, 2003).

12.1 Demonstration Near 1536 nm

FIG. 5A is a block diagram that illustrates an experimental setup 500 for demonstrating delay processing near 1536 nm, according to one embodiment. An external cavity diode laser (ECDL) 512a is centered at 1536 mm and frequency stabilized to a transient spectral hole in one spatial location of a 5 mm long $Er^{3+}$:Y2SiO5 (0.001 at. %) material 560a at 4.2 K in a 3.0 Tesla (T) magnetic field. This IBT material has a $B_M$ of 0.5 GHz. As part of the frequency stabilizing mechanism in this embodiment, a beam from the ECDL 512a is amplified at Erbium-doped fiber amplifier (EDFA) 542 and coupled through fiber couple CC) 502b along optical path 503a. The beam is modulated in electro-optic modulator 511 to form a locking signal that burns a spectral hole in a spatial mode through the IBT material 560a and is detected with detector 514. The signal detected by detector 514 is used by lock circuitry 515a to control the ECDL 512a by electronic coupler 504.

A beam from the stabilized laser is fiber coupled at FC 502a and split into two beams, one along optical path 503c for modulating with interacting pulses ("processing"), and the other along optical path 503b for readout and frequency locking.

The processing beam along path 503c is modulated by a 1 GHz electro-optic phase modulator (EOM) 522a driven by a pulse pattern generator (PPG) 526a and RF amplifier 524. After modulation, the processing beam is amplified by EDFA 544a and fiber coupled in FC 502d. A chopper (not shown) creates a 4 ms off-window in the processing beam to allow readout about 0.5 ms into this window. The processing beam is directed onto non-polarizing beam splitter cube 540a for directing onto the IBT material 560a.

The readout ("probing") beam along optical path 503b is amplified in EDFA 542 and fiber coupled in FC 502c, then operated upon by an acousto-optic modulator (AOM) 530a to create a linear frequency-swept pulse. A mirror, 532a and the non-polarizing beam splitter cube 540a direct the readout beam, collinearly with the processing beams, onto a spatial mode focused on an approximately 50 µm spot on the IBT material. A gating AOM 570 deflects the temporally attenuated readout beam towards a 125 MHz photo-detector 572a. The output from the photo-detector is displayed on oscilloscope 574a and digitized. The digital signal is processed by computer 576.

For the experimental demonstration of coherent integration of dynamic codes, each processing shot (e.g., first set 180 in FIG. 1C) consists of an M-bit binary phase-shift keyed (BPSK) waveform (e.g., first signal 182, representing a RADAR reference signal and a single time delayed replica (e.g., second signal 184 representing a RADAR return signal), where a unique shot, comprising a unique pulse pair, identified by j=1, 2, . . . N was introduced every $\tau_R$ (e.g., repetition interval 177).

The delay $\tau_D$ (e.g., delay 175a) is fixed for all shots. Each processing shot contains a unique, zero-mean BPSK waveform and its time delayed replica. Theory and E simulation shows that using dynamic codes in coherent integration enhances the primary component (oscillating with period $1/\tau_D$) while the other spectral features (e.g., temporal sidelobes) change each shot, so that a ratio of the temporal peak to maximum sidelobe rms approaches $M^2$. While not necessary for achieving coherent integration, dynamic coding was used in the illustrated experimental demonstration.

The optical carrier beam was continuously BPSK modulated, such that each signal was modulated at 0.5 Gbps (Gbps=$10^9$ bits per second) and between shots the optical carrier wave was square wave ( . . . 101010 . . . ) modulated at 1 Gbps (not depicted), resulting in frequency sidebands outside the material's 0.5 GHz absorption profile.

For all experiments, M is 200 (thus each coded waveform was 200 bits, i.e., 400 ns) and the repetition interval $\tau_R$ is 5 μs. The probe pulse power is 10 μW and swept over ~15 MHz of the grating at a rate of 0.2083 MHz/μs using a 165 MHz carrier and the AOM 530. Post processing of the signal digitized from the transmitted probe beam consists of filtering to minimize the strong low-frequency components of the unabsorbed envelope and calculating the magnitude squared of the Fourier transform of the result, using a fast Fourier transform (FFT) process.

Figure 6B:
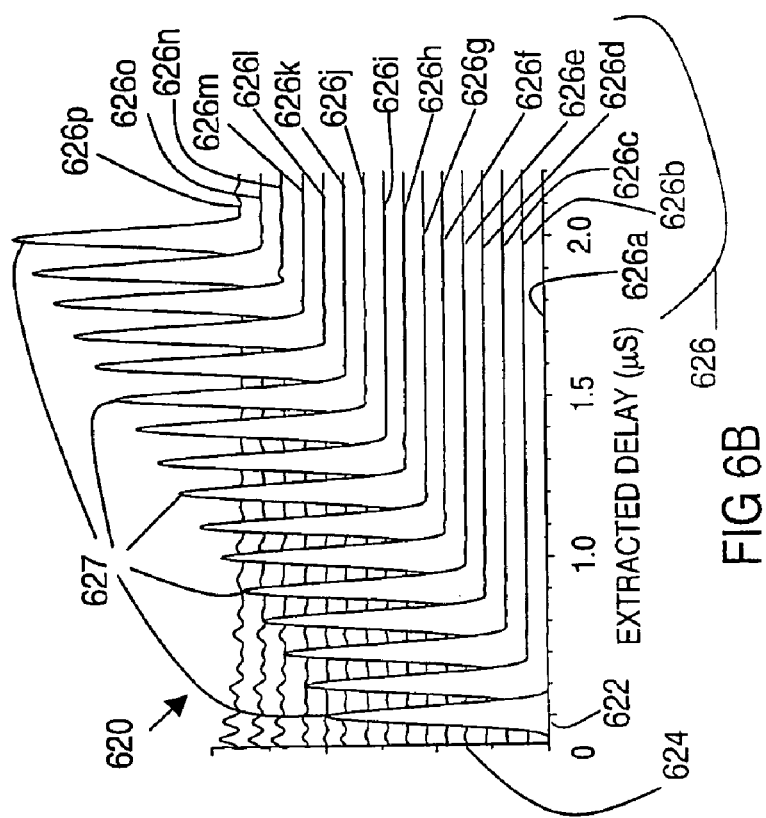
FIG. 6B is a graph that illustrates peaks in cross correlation curves generated from the readout signals of FIG. 6A, according to an embodiment near 1536 nm.
Figure 6A:
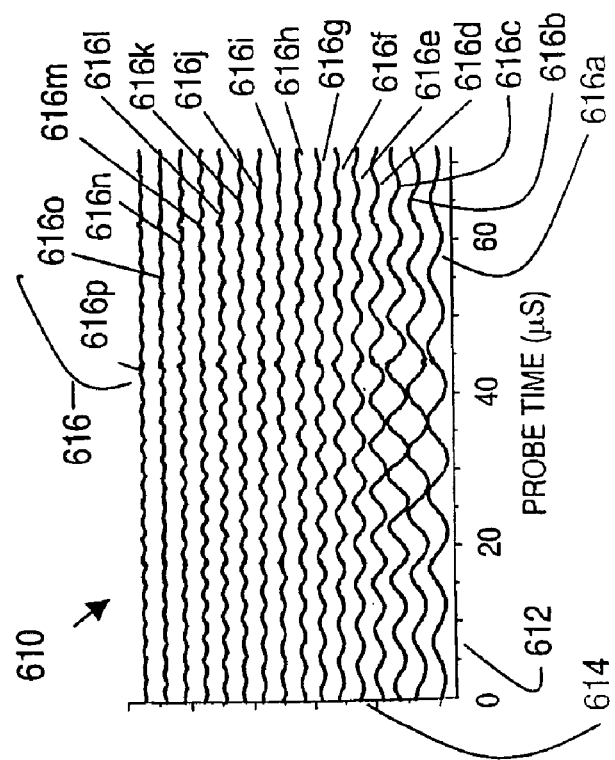
FIG. 6A is a graph that illustrates portions of readout signals from an IBT material, after interaction by a pair of pulses at each of multiple delays, according to an embodiment near 1536 nm.

FIG. 6A is a graph 610 that illustrates portions of readout signals from an IBT material, after interaction by a pair of pulses at each of multiple delays, according to an embodiment. The time axis 612 indicates the time during the frequency sweep of the readout beam, and is related to frequency in the absorption spectrums time values are indicated in μs. The amplitude axis 614 indicates the relative magnitude of transmission, increasing upward, and is inversely proportional to absorption. Amplitude is given in arbitrary units. Each curve 616a through 616p represents the readout signal after 800 shots at 25 mW power with a fixed value for the delay. Each curve is displaced vertically a different amount to allow features to be viewed. The fixed value of the delay increases from 0.5 μs for curve 616a through 2.0 μs for curve 616p, at 0.1 μs per curve 616. The curves 616 represent the filtered raw data, showing grating structure after subtraction of unabsorbed background. A dominant oscillation in the absorption, with period equal to the reciprocal of the delay, is apparent in each curve 616. The amplitude of the dominant oscillation in absorption shows diminishing strength with increasing delay due to homogeneous dephasing.

FIG. 6B is a graph 620 that illustrates peaks in cross correlation curves generated by taking the Fourier transform of the readout signals of FIG. 6A, according to an embodiment. The time axis 622 indicates the delay time between the two interacting pulses. The amplitude axis 624 indicates the relative signal strength of the correlation with delay. Each curve 626a through 626p represents the cross correlation of a corresponding readout signal in FIG. 6A. Each curve 626 is displaced vertically a different amount to allow features to be viewed. The fixed value of the delay increases from 0.5 μs for curve 616a through 2.0 μs for curve 616p, at 0.1 μs per curve.

The Fourier transform that produces curves 626 shows frequency analysis of the corresponding curves 616, to reveal the programmed time delays corresponding to the dominant oscillation in absorption. The amplitudes of curves 626 are the magnitude squared of the Fast Fourier Transform of the curves 616, plotted on a linear scale. The primary peaks represent the extracted time delay. The amplitudes of curves 626 are normalized so that the major peak has the same height in each curve 626 to better show the locations of the primary peaks. Analysis of the delay time at the peaks' centers showed a delay resolution of about 1 ns, expected for an approximately 15 MHz probe bandwidth.

The non-normalized data exhibits decaying peak strength with increasing delay due to material dephasing. For one set of shots with 25 mW and another set of shots with 40 mW power, the peak strength was fit to a first order exponential decay, of the form $\exp(-2\tau_D/T2)$ to derive estimates of T2 for the material. T2 values of 0.84 μs and 0.79 μs, respectively, were obtained. The slight decrease in coherence time with higher processing power is attributed to spectral diffusion.

Figure 6C:
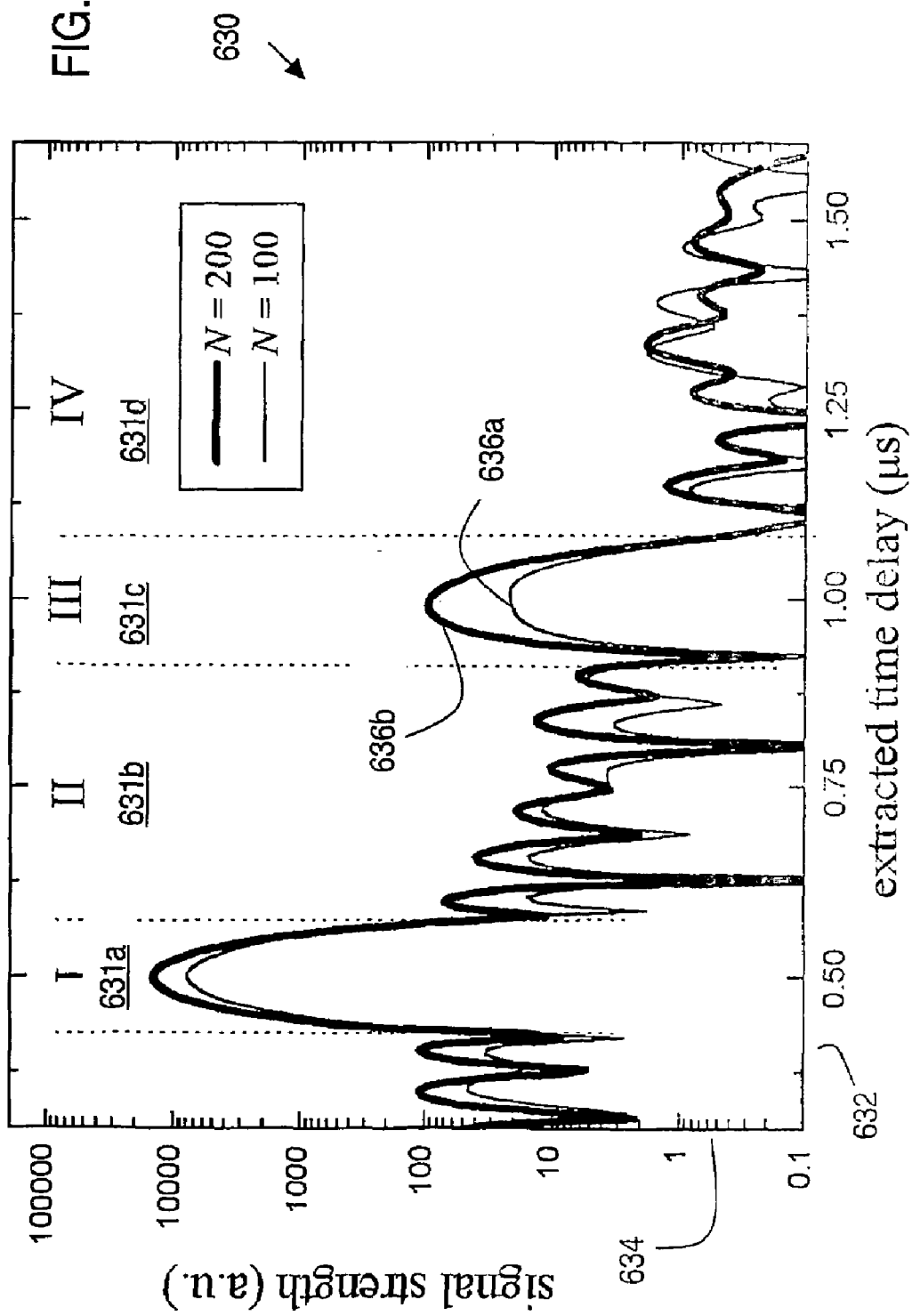
FIG. 6C is a graph that illustrates a comparison between cross correlation curves generated from readout signals for pulses with fixed delay after integration over different numbers of shots of such pulses, according to an embodiment near 1536 nm.

FIG. 6C is a graph 630 that illustrates a comparison between cross correlation curves generated from readout signals for pulses with fixed delay after different numbers of shots of such pulses, according to an embodiment. The time axis 632 indicates the delay time between the two interacting pulses. The amplitude axis 634 indicates the relative signal strength of the correlation with delay, plotted on a logarithmic scale to show more structure at low signal strength. Both curves 636a and 636b were derived from readout signals produced by 40 mW power interacting pulses with $\tau_D$=0.5 μs. Curve 636a is based on a readout signal produced after 100 shots (N=100); and curve 636b is based on a readout signal produced after 200 shots N=200). Post processing of the raw data that produced these traces consisted of filtering to minimize the strong low-frequency components of the unabsorbed chirped pulse envelope, performing a FFT on the result and plotting its magnitude squared.

The figure is broken into four regions 631: 631a (region I) contains the primary peak representing the time delay; 631b (region II) contains the fight temporal correlation sidelobes (RSL); 631c (region III) contains the second harmonic $2\tau_D$ of the primary peak; and 631d (region I) contains the system background noise. The peak temporal width is about 65 ns (full width at half maximum) as set by the probing bandwidth Br. The two traces show that the signal strengths increase after doubling N.

Figures 6D, 6E:
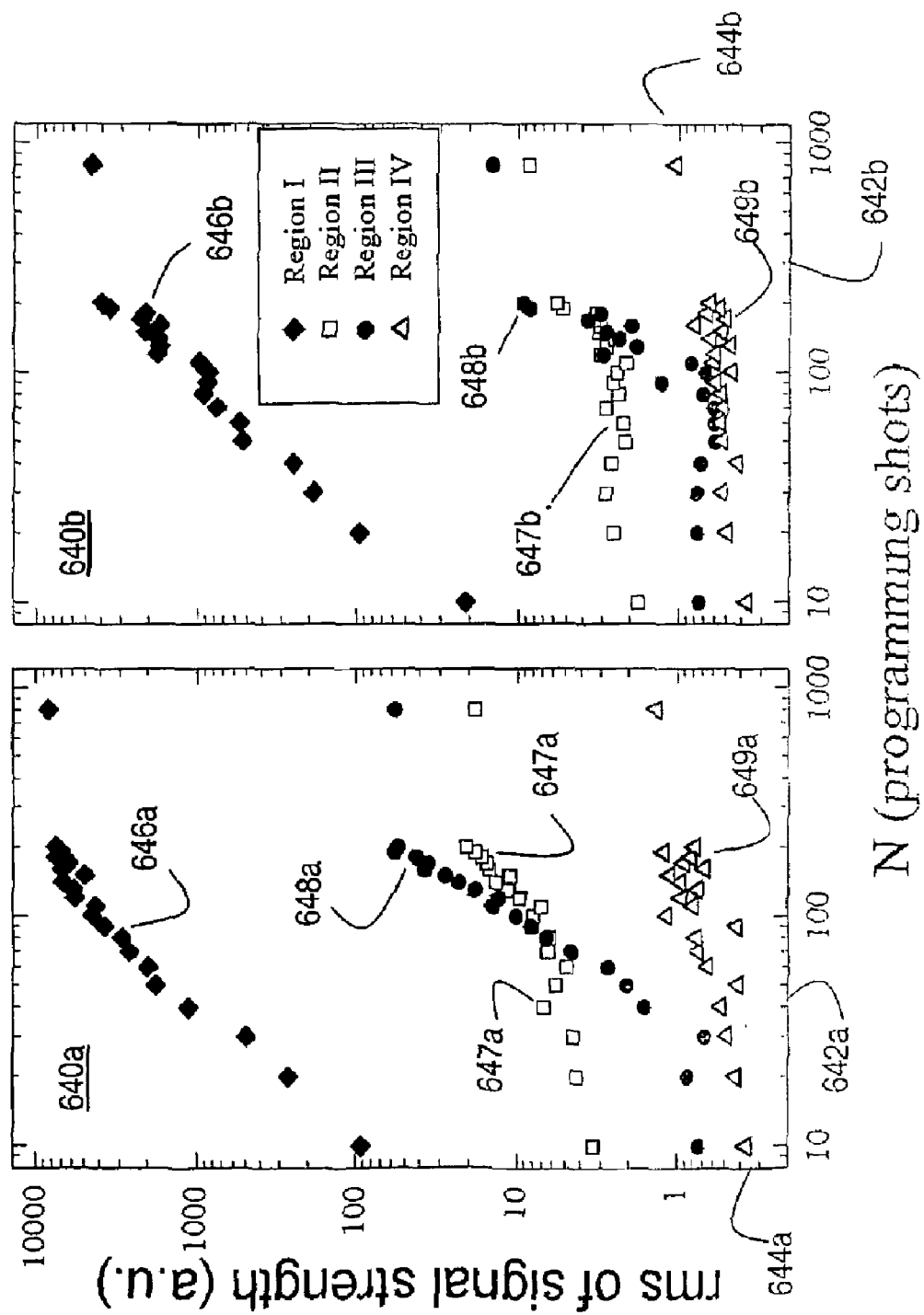
FIG. 6D is a graph that illustrates a dependence on the number of shots for signal strength in different portions of a cross correlation curve for two pulses with fixed delay, for a particular pulse power, according to an embodiment near 1536 nm.
FIG. 6E is a graph that illustrates a dependence on the number of shots for signal strength in different portions of a cross correlation curve for two pulses with fixed delay, for a different pulse power, according to an embodiment near 1536 nm.

FIG. 6D is a graph 640a that illustrates a dependence on the number of shots for signal strength in different portions of a cross correlation curve for two pulses with fixed delay, for a particular pulse power, according to an embodiment. FIG. 6E is a graph 640b that illustrates a similar dependence for a different pulse power, according to an embodiment. In both graphs 640a, 640b, the horizontal axis 642a, 642b, respectively, represents a number of shots N during the integration of the interaction absorption spectrum on a logarithmic scale to show more structure at low numbers of shots. In both graphs, the vertical axis 644a, 644b, respectively, is the rms signal strength in arbitrary units on a logarithmic scale to show more structure at low signal strength. In both graphs, the value of $\tau_D$=0.5 μs. Graph 640a is for shots with pulse power of 40 mW; and graph 640b is for shots with a lower pulse power of 25 mW.

Points 646a and 646b represent the calculated rms values for region I, versus number of processing shots at 40 mW and 25 mW, respectively. In 646a, region I, represented by points 646a, increases as $N^{1.65}$ (thus α=0.825, based on a non-linear fit showing 0.99 agreement) up to a compression point at about 140 shots, then approaches a steady state, as shown by the data point at N=800.

Points 648a and 648b represent the calculated rms values for region III versus number of processing shots at 40 mW and 25 mW, respectively. In graph 640a, the second harmonic in region III, remains in the noise floor until about N=50 shots, and then grows as $N^{2.44}$ (based on a non-linear fit showing 0.98 agreement) up to 200 shots.

Graph 640b shows the effect of a lower processing power under otherwise identical conditions. Here, the peak represented by points 646b increases as $N^{1.57}$ (thus α=0.785, based on a non-linear fit showing 0.98 agreement) for 200 shots, reaching strength roughly half of the values reached by points 646a. At N=90, the second harmonic, represented by points 648b, grows as $N^{2.36}$ up to 200 shots (based on a non-linear fit with 0.76 agreement).

Points 647a and 647b represent the calculated rms values for region II versus number of processing shots at 40 mW and 25 mW, respectively. Points 649a and 649b represent the calculated rms values for region IV versus number of processing shots at 40 mW and 25 mW, respectively. The calculated relative strengths of regions I, II and III include frequency components that offset them above the noise floor, due to the AOM frequency response function and imperfect post processing techniques, limiting absolute comparison between the regions. However, it is interesting to note the relatively flat nature of region II, especially for 25 mW processing power. This reveals the effect of dynamic coding for each shot on the accumulation of the temporal sidelobe for region II until nonlinearities dominate.

12.2 Demonstration Near 793 nm

Recent experimental results of baseband signal processing of 1 GHz BPSK signals are presented in this section, showing: 1) time delay and resolution, 2) coherent integration of correlations, and 3) dynamic pattern processing.

Figure 5B:
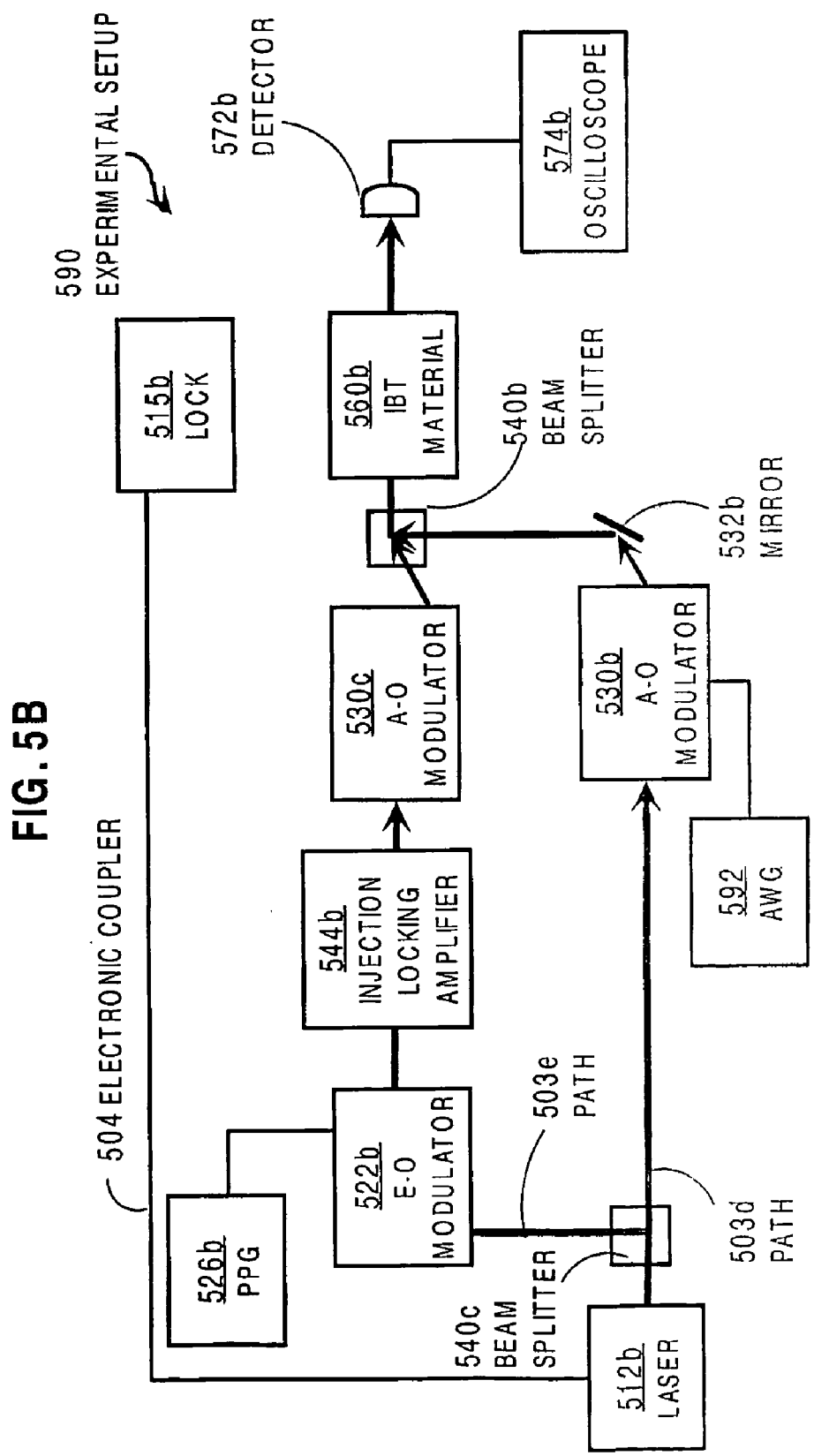
FIG. 5B is a block diagram that illustrates an experimental setup for demonstrating delay processing, according to an embodiment near 793 nm.

An optical beam stabilized to sub-10 kHz over 10 ms by locking to a transient spectral hole in Tm:YAG, is electro-optically encoded and amplified with injection locking before irradiating the IBT material. An experimental setup for this demonstration has been assembled utilizing existing technology and materials. FIG. 5B is a block diagram that illustrates the experimental setup 590 for demonstrating delay processing, according to an embodiment near 793 nm A cw Ti:Sapphire laser 512b is centered at 793.377 nm and frequency stabilized to a transient spectral hole in one spatial location of a 4 mm long Tm:YAG (0.1 at. %) material 560b at 5.0 K using lock 515b. The stabilized laser was split into two beams 503e, 503d by beam splitter 540c for processing and readout, respectively. The processing beam along optical path 503e was modulated by an electro-optic phase modulator (EOM) 522b driven by a pulse pattern generator 526b. The optical carrier beam was continuously BPSK modulated, such that each pattern was modulated at 1 Gbps onto the modulated optical beams; and between any patterns the light was square wave ( . . . 101010 . . . ) modulated at 1 Gbps. After modulation, the processing beams were amplified by injection locking a high-powered slave diode laser in injection locking amplifier 544b. The processing beam is directed onto the IBT material 560b through acousto-optic modulator (AOM) 530c and beam splitter 540b. The readout beam was modulated by an acousto-optic modulator (AOM) 530b driven by an arbitrary waveform generator (AWG) 592 that generates a linear frequency chirped pulse around a 265 MHz carrier. A beam splitter cube 540b was used to align the beams, which were focused to an approximately 50 μm spot in the IBT material 560b. The transmitted readout beam is then incident on a 125 MHz photo-detector 572b. The detector results are displayed and Fourier transformed in oscilloscope and FFT device 574b.

Each processing shot consisted of an M-bit binary-phase shift keyed (BPSK) waveform (e.g., representing a RADAR reference signal) and a single time delayed replica (e.g., representing a RADAR return signal). A unique pulse pair j=1, 2, . . . N was introduced every $\tau_R$=1/PRF. The delay $\tau_D$ is fixed for all shots. Each processing shot contains a unique, zero-mean BPSK waveform and its time delayed replica. For all experiments, M is 512, i.e., the processing waveforms were 512 bits (512 ns) BPSK sequences, and the PRF was 100 kHz. The processing beam power was 2.5 mW. The readout beam power was 100 μW and chirped over about 40 MHz at a rate sufficient to resolve the longest time delay.

The chirp rate was less than $(1/\tau_{Dmax})^2$, where $\tau_{Dmax}$ is the maximum resolvable delay, in order to ensure sufficient spectral resolution. For example, if the chirp rate is 1.0 MHz/μs, then for 1 GHz grating bandwidth, the latency is 1.0 ms, and the required detection bandwidth is 1 MHz. Higher readout bandwidths give larger dynamic ranges.

Figure 7A:
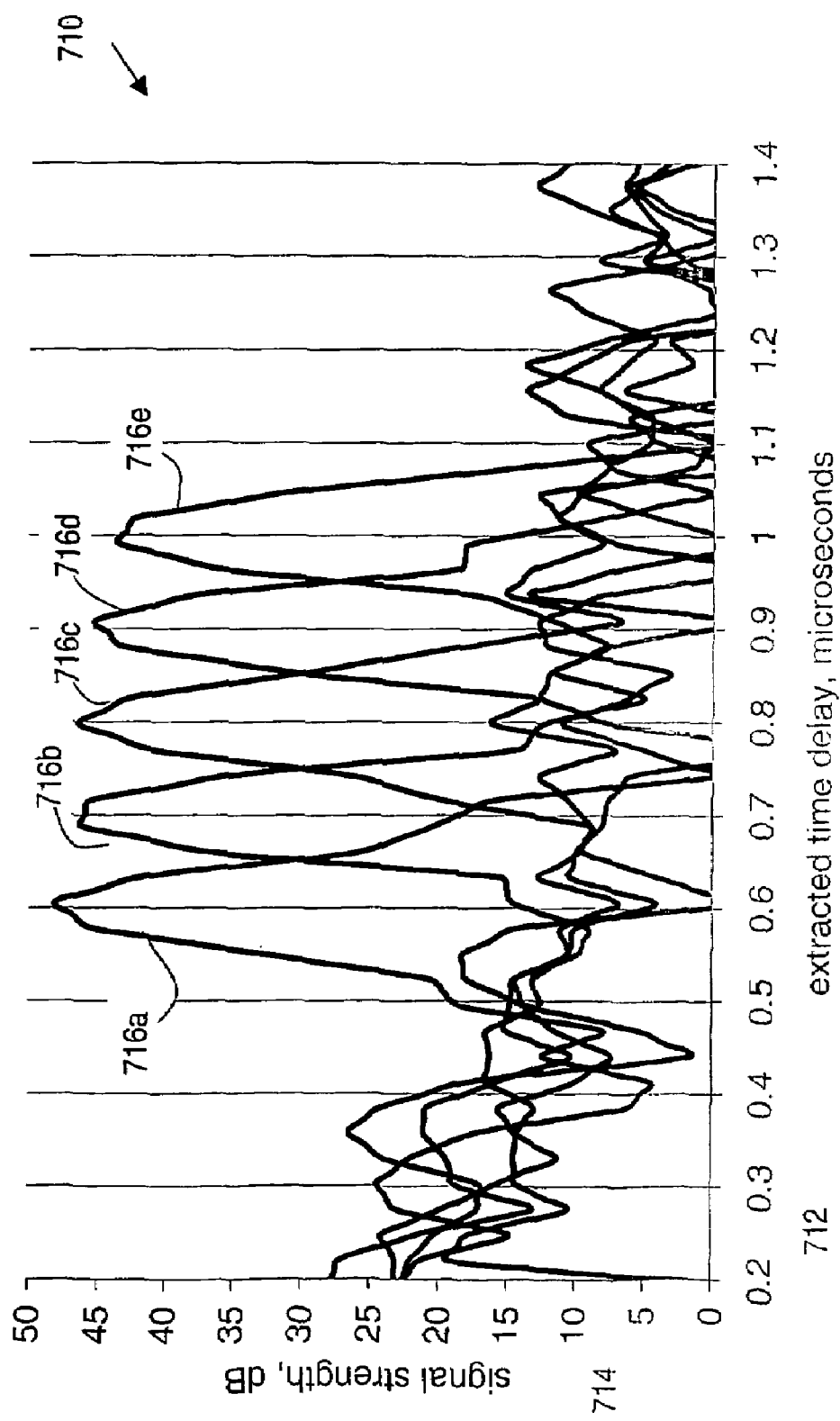
FIG. 7A is a graph that illustrates a dependence on the delay time of a peak in a cross correlation derived from a readout signal from an IBT material, according to an embodiment near 793 nm.

FIG. 7A is a graph 710 that illustrates a dependence on the delay time of a peak in a cross correlation derived from a readout signal from an IBT material, according to this embodiment. The horizontal axis 712 is delay time. The vertical axis is signal strength in dB for the log magnitude squared of the Fast Fourier Transform of a digital signal derived from the readout signal. Curves 716a thorough 716e (collectively referenced hereinafter as curves 716) show the results of processed time delays ranging from 0.6 to 1.0 μs, respectively, in increments of 0.1 μs.

The peak widths depend on the readout bandwidth and the peak signal decreases with increasing time delay due to finite material coherence time. Under these conditions, dynamic range >40 dB and range jitter <1 ns are observed. Higher temporal resolution and dynamic range can be expected at higher readout bandwidths.

Figure 7B:
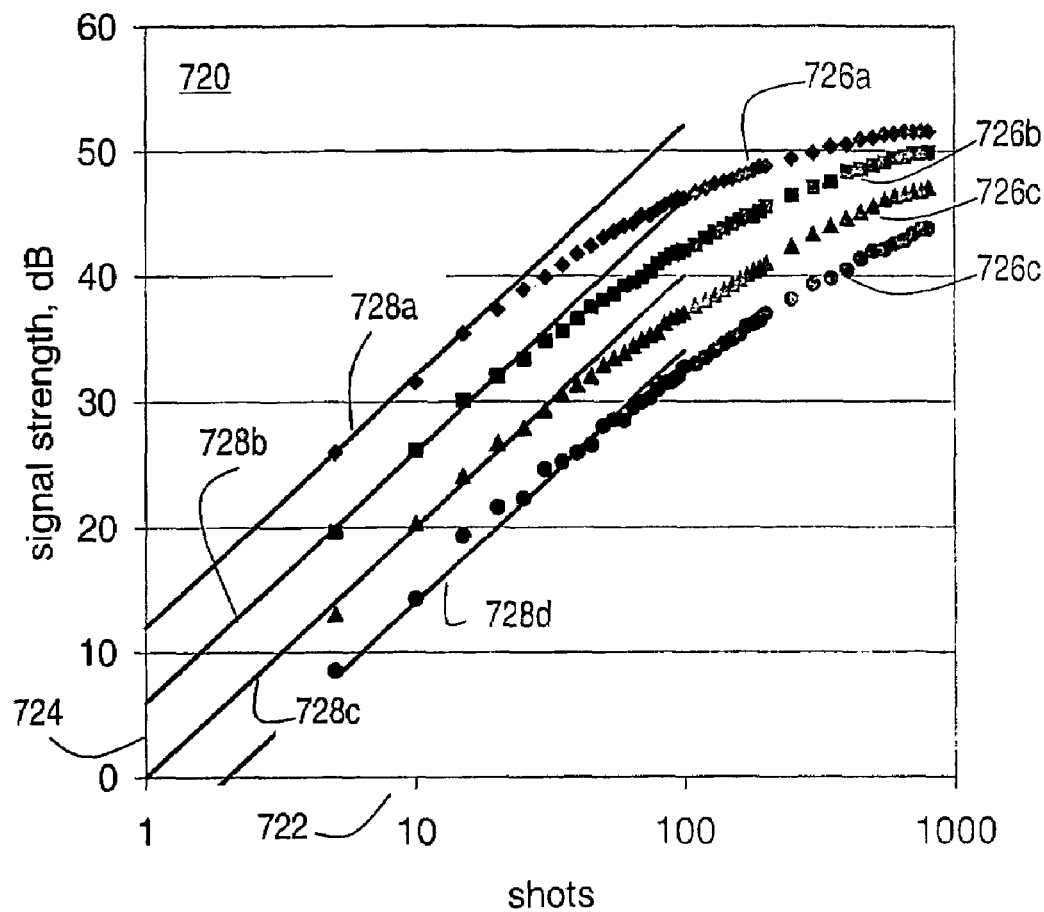
FIG. 7B is a graph that illustrates a dependence on power and number of shots of the peak in a cross correlation derived from a readout signal, according to an embodiment near 793 nm.

FIG. 7B is a graph 720 that illustrates a dependence on power and number of shots for the peak in a cross correlation derived from a readout signal, according to an embodiment. The horizontal axis 722 represents numbers of shots N during integration, on a logarithmic scale. The vertical axis represents rms peak signal strength in dB, which is logarithmic in amplitude. The points 726a represent the dependence on number of shots for 2.5 mW processing power. The points 726b, 726c, 726d represent the dependence on number of shots for other processing powers, respectively, decreasing by factors of 2. Ideal coherent accumulation, proportional to $N^2$, is shown for the corresponding powers in lines 728a, 728b, 728c, 728d, respectively.

All points 726a, 726, 726c, 726d (collectively referenced hereinafter as points 726) represent processing pulses with a fixed delay ($\tau_D$=1 μs). The processing powers are 2.5 mW, 1.25 mW, 0.625 mW and 0.3125 mW for points 726a, 726b, 726c, 726d, respectively. Each set of points shows that the processed signal strength initially grows ideally as the square of the number of shots, as expected, but then exhibits power dependent roll-off, due to saturation, before reaching a steady state. In general, for lower power, more shots can be ideally coherently integrated. For 0.3125 mW, the saturation point is roughly 85 shots, while for 2.5 mW it is roughly 15 shots. When the power is raised to 5 mW (not shown) the integration varied, indicating coherent saturation of the individual processing shots.

Dynamic or agile coding is a desirable feature for advanced RADAR systems. FIG. 7C is a graph 730 that illustrates a dependence on number of shots for the peak in a cross correlation derived from a readout signal using multiple pulse patterns, according to an embodiment. The horizontal axis 732 represents numbers of shots N during integration, on a logarithmic scale. The vertical axis represents rms signal strength in dB, which is logarithmic in amplitude. The points 736a represent the signal strength of the peak and the points 736b, represent the signal strength of the left side lobes (for delays shorter than the peak delay) for agile coding. The difference is a measure of the dynamic range of the processing to discover the peak and the corresponding delay. The points 737a represent the signal strength of the peak and the points 737b, represent the signal strength of the left side lobes for single pattern coding.

FIG. 7D is a graph 740 that illustrates a dependence or multiple pulse patterns of the cross correlation derived from a readout signal, according to an embodiment. The horizontal axis 742 is time, and the vertical axis 744 is signal strength in dB, which is logarithmic in amplitude. Curve 746 represents the cross correlation after 800 shots using different codes in different shots (agile coding). Curve 747 represents the cross correlation after 800 shots using the same code in every shot (single pattern coding).

FIG. 7C shows the evolution of the signal and side-lobe strengths for agile and single pattern processing. The signal growth for both is nearly identical. But, while the fixed side lobes of single pattern grow with the signal, the varying side-lobes of dynamic patterns average out. FIG. 7D shows the difference between the full cross correlation curves for agile and single pattern processing after 800 shots. An enhancement of about 25 dB in dynamic range was achieved under these conditions using dynamic coding at 800 shots compared to single pattern coding.

12.3 Further Demonstration Near 793 nm

Recent experimental results were also obtained with 2.5 GHz BPSK baseband signals and also with a 1.0 GHz baseband mixed up onto a 1.75 GHz RF carrier. Those results extended the demonstration of analog processing of higher bandwidth signals and to high bandwidth signals on intermediate frequencies.

13. Digital Processor Overview

FIG. 8 is a block diagram that illustrates a computer system 800 upon which an embodiment of the invention may be implemented. Computer system 800 includes a communication mechanism such as a bus 810 for passing information between other internal and external components of the computer system 800. Information is represented as physical signals of a measurable phenomenon, typically electric voltages, but including, in other embodiments, such phenomena as magnetic, electromagnetic, pressure, chemical, molecular and atomic interactions. For example, north and south magnetic fields, or a zero and non-zero electric voltage, represent two states (0, 1) of a binary digit (bit). A sequence of binary digits constitutes digital data that is used to represent a number or code for a character. A bus 810 includes many parallel conductors of information so that information is transferred quickly among devices coupled to the bus 810. One or more processors 802 for processing information are coupled with the bus 810. A processor 802 performs a set of operations on information. The set of operations include bringing information in from the bus 810 and placing information on the bus 810. The set of operations also typically include comparing two or more units of information, shifting positions of units of information, and combining two or more units or information, such as by addition or multiplication. A sequence of operations to be executed by the processor 802 constitutes computer instructions.

Computer system 800 also includes a memory 804 coupled to bus 810. The memory 804, such as a random access memory (RAM) or other dynamic storage device, stores information including computer instructions. Dynamic memory allows information stored therein to be changed by the computer system 800. RAM allows a unit of information stored at a location called a memory address to be stored and retrieved independently of information at neighboring addresses. The memory 804 is also used by the processor 802 to store temporary values during execution of computer instructions. The computer system 800 also includes a read only memory (ROM) 806 or other static storage device coupled to the bus 810 for storing static information, including instructions, that is not changed by the computer system 800. Also coupled to bus 810 is a non-volatile (persistent) storage device 808, such as a magnetic disk or optical disk, for storing information, including instructions, that persists even when the computer system 800 is turned off or otherwise loses power.

Information, including instructions, is provided to the bus 810 for use by the processor from an external input device 812, such as a keyboard containing alphanumeric keys operated by a human user, or a sensor. A sensor detects conditions in its vicinity and transforms those detections into signals compatible with the signals used to represent information in computer system 800. Other external devices coupled to bus 810, used primarily for interacting with humans, include a display device 814, such as a cathode ray tube (CRT) or a liquid crystal display (LCD), for presenting images, and a pointing device 816, such as a mouse or a trackball or cursor direction keys, for controlling a position of a small cursor image presented on the display 814 and issuing commands associated with graphical elements presented on the display 814.

In the illustrated embodiment, special purpose hardware, such as an application specific integrated circuit (IC) 820, is coupled to bus 810. The special purpose hardware is configured to perform operations not performed by processor 802 quickly enough for special purposes. Examples of application specific ICs include graphics accelerator cards for generating images for display 814, cryptographic boards for encrypting and decrypting messages sent over a network, speech recognition, and interfaces to special external devices, such as robotic arms and medical scanning, equipment that repeatedly perform some complex sequence of operations that are more efficiently implemented in hardware.

Computer system 800 also includes one or more instances of a communications interface 870 coupled to bus 810. Communication interface 870 provides a two-way communication coupling to a variety of external devices that operate with their own processors, such as printers, scanners and external disks. In general the coupling is with a network link 878 that is connected to a local network 880 to which a variety of external devices with their own processors are connected. For example, communication interface 870 may be a parallel port or a serial port or a universal serial bus (USB) port on a personal computer. In some embodiments, communications interface 870 is an integrated services digital network (ISDN) card or a digital subscriber line (DSL) card or a telephone modem that provides an information communication connection to a corresponding type of telephone line. In some embodiments, a communication interface 870 is a cable modem that converts signals on bus 810 into signals for a communication connection over a coaxial cable or into optical signals for a communication connection over a fiber optic cable. As another example, communications interface 870 may be a local area network (LAN) crud to provide a data communication connection to a compatible LAN, such as Ethernet. Wireless links may also be implemented. For wireless links, the communications interface 870 sends and receives electrical, acoustic or electromagnetic signals, including infrared and optical signals that carry information streams, such as digital data. Such signals are examples of carrier waves.

The term computer-readable medium is used herein to refer to any medium that participates in providing instructions to processor 802 for execution. Such a medium may take many forms, including, but not limited to, non-volatile media, volatile media and transmission media. Non-volatile media include, for example, optical or magnetic disks, such as storage device 808. Volatile media include, for example, dynamic memory 804. Transmission media include, for example, coaxial cables, copper wire, fiber optic cables, and waves that travel through space without wires or cables, such as acoustic waves and electromagnetic waves, including radio, optical and infrared waves. Signals that are transmitted over transmission media are herein called carrier waves.

Common forms of computer-readable media include, for example, a floppy disk, a flexible disk, a hard disk, a magnetic tape, or any other magnetic medium, a compact disk ROM (CD-ROM), or any other optical medium, punch cards, paper tape, or any other physical medium with patterns of holes, a RAM, a programmable ROM (PROM), an erasable PROM (EPROM), a FLASH-EPROM, or any other memory chip or cartridge, a carrier wave, or any other medium from which a computer can read.

Network link 878 typically provides information communication through one or more networks to other devices that use or process the information. For example, network link 878 may provide a connection through local network 880 to a host computer 882 or to equipment 884 operated by an Internet Service Provider (ISP). ISP equipment 884 in turn provides data communication services through the public, world-wide packet-switching communication network of networks now commonly referred to as the Internet 890. A computer called a server 892 connected to the Internet provides a service in response to information received over the Internet. For example, server 822 provides information representing video data for presentation at display 814.

The invention is related to the use of computer system 800 for implementing the techniques described herein. According to one embodiment of the invention, those techniques are performed by computer system 800 in response to processor 802 executing one or more sequences of one or more instructions contained in memory 804. Such instructions, also called software and program code, may be lead into memory 804 from another computer-readable medium such as storage device 808. Execution of the sequences of instructions contained in memory 804 causes processor 802 to perform the method steps described herein. In alternative embodiments, hardware, such as application specific integrated circuit 820, may be used in place of or in combination with software to implement the invention. Thus, embodiments of the invention are not limited to any specific combination of hardware and software.

The signals transmitted over network link 878 and other networks through communications interface 870, which carry information to and from computer system 800, are exemplary forms of carrier waves. Computer system 800 can send and receive information, including program code, through the networks 880, 890 among others, through network link 878 and communications interface 870. In an example using the Internet 890, a server 892 transmits program code for a particular application, requested by a message sent from computer 800, through Internet 890, ISP equipment 884, local network 880 and communications interface 870. The received code may be executed by processor 802 as it is received, or may be stored in storage device 808 or other non-volatile storage for later execution, or both. In this manner, computer system 800 many obtain application program code in the form of a carrier wave.

Various forms of computer readable media may be involved in carrying one or more sequence of instructions or data or both to processor 802 for execution. For example, instructions and data may initially be carried on a magnetic disk of a remote computer such as host 882. The remote computer loads the instructions and data into its dynamic memory and sends the instructions and data over a telephone line using a modem. A modem local to the computer system 800 receives the instructions and data on a telephone line and uses an infra-red transmitter to convert the instructions and data to an infra-red signal, a carrier wave serving as the network link 87S. An infrared detector serving as communications interface 870 receives the instructions and data carried in the infrared signal and places information representing the instructions and data onto bus 810. Bus 810 carries the information to memory 804 from which processor 802 receives and executes the instructions using some of the data sent with the instructions. The instructions and data received in memory 804 may optionally be stored on storage device 808, either before or after execution by the processor 802.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A method of processing large bandwidth signals over long times, resulting in high time-bandwidth-product (TBP) signal processing, comprising the steps of:

causing a first plurality of signals on optical carriers to interact in a material with an inhomogeneously broadened absorption spectrum including a plurality of homogeneously broadened absorption lines during about a phase coherence time of the homogeneously broadened absorption lines to record an interaction absorption spectrum; and within about a population recovery time for a population of optical absorbers in the material, reading the interaction absorption spectrum to produce a readout signal that represents a temporal map of the interaction absorption spectrum, wherein the readout signal includes frequency components that relate to a processing result of processing the first plurality of signals.

2. The method of claim 1, wherein the material has an inhomogeneously broadened absorption spectrum with a bandwidth greater than about one GigaHertz ($10^9$ Hz) and homogeneously broadened absorption lines with bandwidths less than about 100 kiloHertz ($10^5$ Hz), for processing signals with a TBP greater than $10^4$.

3. The method of claim 2, wherein a TBP of a first signal in the first plurality of signals is greater than $10^4$.

4. The method of claim 1, said step of reading the interaction absorption spectrum in the material to produce a readout signal further comprising measuring absorption of a frequency chirped optical signal directed into the material.

5. The method of claim 1, said step of reading absorption of the frequency claim 1, wherein the readout signal is produced with a bandwidth substantially less than a minimum bandwidth of the first plurality of signals.

6. The method of claim 1, wherein the readout signal is produced with a bandwidth less than about ten MegaHertz ($10^7$ Hz).

7. The method of claim 1, said step of reading the interaction absorption spectrum further comprising modulating an optical carrier to produce a modulated optical signal that includes a component for which frequency sweeps in time across a frequency band within the inhomogeneously broadened absorption spectrum;

directing the modulated optical signal on the material; and measuring the optical absorption in time.

8. The method of claim 1, wherein:

said step of causing the first plurality of signals to interact further comprises directing the first plurality of signals on the optical carriers along a first spatial mode in the material to record the interaction absorption spectrum that represents a multiplication of spectra of the first plurality of signals; and said readout signal includes frequency components that relate to the results of correlating the first plurality of signals.

9. The method of claim 8, further comprising determining a time delay between two signals in the first plurality of signals based on the readout signal.

10. The method of claim 9, wherein:

a first signal of the first plurality of signals represents a RADAR transmitted signal;

a second signal of the first plurality of signals represents a received reflected signal based on the RADAR transmitted signal reflected from a target;

the method further comprises determining a range to the target based on the time delay between the first signal and the second signal.

11. The method of claim 9, wherein:

a first signal of the first plurality of signals represents a first component received at a first antenna element of an antenna array;

a second signal of the first plurality of signals represents a second component received at a second antenna element of the antenna array;

the method further comprises determining an angle of arrival of a signal received at the antenna array based on the time delay between the first signal and the second signal.

12. The method of claim 8, further comprising, before a first time on the order of the population recovery time expires after the first plurality of signals, performing the step of directing an additional plurality of signals on optical carriers, of one or more additional pluralities of signals, along the first spatial mode in the material at a second time after an immediately previous plurality of signals, to integrate in the interaction absorption spectrum an additional spectrum that represents a multiplication of spectra of the additional plurality of signals.

13. The method of claim 12, wherein:

said step of directing the additional plurality of signals along the first spatial mode includes directing the additional plurality of signals which have a particular time delay that is substantively similar to a time delay in the first plurality of signals;

said step of reading the interaction absorption spectrum produces a readout signal with a particular value for certain frequency components that are related to the particular time delay; and the particular value is enhanced relative to other values for other frequency components that are related to time delays that are substantively different from the particular time delay.

14. The method of claim 13, wherein:

a first signal of each plurality of signals represents a RADAR transmitted signal; and a second signal of each plurality of signals represents a received reflected signal based on the RADAR transmitted signal reflected from a target.

15. The method of claim 14, wherein the RADAR transmitted signal in each plurality of signals is the same as the RADAR transmitted signal in a different plurality of signals.

16. The method of claim 14, wherein the RADAR transmitted signal in each plurality of signals is different from the RADAR transmitted signal a different plurality of signals.

17. The method of claim 1, said step of causing the first plurality of signals on optical carriers to interact in the material, further comprising the steps of:

modulating an optical carrier, tuned to one homogeneously broadened absorption line in the material, to carry each signal of the plurality of signals as a modulated optical signal; and directing each modulated optical signal onto the material with sufficient intensity to record in the material the spectral content of each signal.

18. The method of claim 17, said step of modulating the optical carrier further comprising using an electro-optic modulator (EOM) to perform at least one of analog phase modulation and phase binary encoding of the optical carrier based on an input electrical signal.

19. The method of claim 17, said step of directing each modulated optical signal onto the material with sufficient intensity further comprising amplifying the modulated optical signal and directing an amplified modulated optical signal onto the material.

20. The method of claim 1, wherein:

said step of causing the first plurality of signals on optical carriers to interact in the material to record an interaction absorption spectrum further comprising causing the first plurality of signals on optical carriers to interact differently in each spatial mode of a plurality of spatial modes to record a plurality of interaction absorption spectra corresponding to the plurality of spatial modes; and said step of reading the interaction absorption spectrum to produce a readout signal further comprises reading the plurality of interaction absorption spectra to produce a plurality of readout signals corresponding to the plurality of interaction absorption spectra; and wherein each readout signal of the plurality of readout signals includes frequency components that relate to a processing result of processing a plurality of signals in a corresponding spatial mode of the plurality of spatial modes.

21. The method of claim 20, wherein:

said step of causing the first plurality of signals on optical carriers to interact differently in each spatial mode of the second plurality of spatial modes further comprising frequency shifting a particular signal from the first plurality of signals by a different frequency shift for each spatial mode of the second plurality of spatial modes; and the method further comprises determining a Doppler shift based on a particular frequency shift applied at a particular spatial mode associated with a particular readout signal of the plurality of readout signals.

22. The method of claim 21, wherein:

a first signal of the first plurality of signals represents a RADAR transmitted signal;

a second signal of the first plurality of signals represents a received reflected signal based on the RADAR transmitted signal reflected from a target;

said step of shifting a particular signal from the first plurality of signals comprises shifting the first signal by a different frequency shift for each spatial mode of the second plurality of spatial modes; and said step of determining the Doppler shift further comprises selecting the particular readout signal that provides a greatest signal strength among a plurality of signal strengths corresponding to the plurality of readout signals.

23. The method of claim 22, further comprises determining a range based on a time delay based on the particular readout signal and determining a velocity based on the Doppler shift.

24. The method of claim 1, wherein:
said step of causing the first plurality of signals on optical carriers to interact in the material,
further comprises the steps of
directing a first beam of the first plurality of signals on optical carriers into the material along a first spatial mode; and
directing a different second beam of the first plurality of signals on optical carriers into the material along a different second spatial mode that intersects the first spatial mode inside the material; and
said step of reading the interaction absorption spectrum further comprises the steps of:
directing a frequency chirp signal along a third spatial mode, phase matched to the first spatial mode and the second spatial mode; and
causing an output signal and a replica of the frequency chirp to coherently interfere with each other to produce the readout signal.

25. An apparatus for processing high time-bandwidth-product (TBP) signals, comprising:
a signal input port for receiving a signal set of one or more pluralities of input signals;
a material with an inhomogeneously broadened absorption spectrum including a plurality of homogeneously broadened absorption lines;
a first optical coupler to direct a plurality of modulated optical signals based on each plurality of input signals in the signal set onto the material in a set of one or more spatial modes within about a phase coherence time of a homogeneously broadened absorption line to record an interaction absorption spectrum that represents spectral processing of the plurality of input signals;
a source of a probing signal; and
a detector to measure, with time, based on the interaction absorption spectrum and the probing signal, a readout signal that represents a temporal map of the interaction absorption spectrum,
wherein the readout signal includes frequency components that relate to a processing result of processing the first plurality of signals.

26. The apparatus of claim 25, further comprising an analog-to-digital converter (ADC) to digitize the readout signal.

27. The apparatus of claim 25, said source of the probing signal further comprising a source of a chirped optical signal that spans over time a frequency band in the inhomogeneously broadened absorption spectrum of the material.

28. The apparatus of claim 27, wherein the detector measures the readout signal by measuring light transmitted through the material from the chirped optical signal.

29. The apparatus of claim 27, wherein the detector measures the readout signal by measuring a coherent interaction between a replica of the chirped optical signal and an echo stimulated in the material by the chirped optical signal.

30. The apparatus of claim 25, further comprising a post processor to determine a processing result based on the readout signal.

31. The apparatus of claim 25, further comprising:
a first source of an optical carrier tuned to one homogeneously broadened absorption line; and
a first modulator optically connected to the source of the optical carrier and connected to the signal input port to output the plurality of modulated optical signals based on each plurality of input signals in the signal set.

32. The apparatus of claim 25, further comprising a second optical coupler to direct the probing signal into the material.

33. The apparatus of claim 31, the source of the probing signal further comprising a second modulator optically connected to the first source to generate the chirped optical signal based on the optical carrier.

34. The apparatus of claim 25, wherein the material has an inhomogeneously broadened absorption spectrum with a bandwidth greater than one GigaHz ($10^9$ Hertz) and homogeneously broadened absorption lines with bandwidths less, than about 100 kiloHertz ($10^5$ Hz), for processing a signal in the set of one or more pluralities of input signals with a TBP greater than $10^4$.

35. The apparatus of claim 25, wherein the detector has a bandwidth less than about ten MegaHertz ($10^7$ Hz).

36. The apparatus of claim 26, wherein the ADC has a bandwidth less than about ten MegaHertz ($10^7$ Hz).

37. The apparatus of claim 31, the first source further comprising an external cavity diode laser.

38. The apparatus of claim 31, the first source further comprising a frequency stabilization system in which a tuned frequency is stabilized to a transient spectral hole at a spatial mode in the material different from any spatial mode in the set of one or more spatial modes.

39. The apparatus of claim 31, the first modulator further comprising one or more electro-optic phase modulators.

40. The apparatus of claim 31, further comprising a high bandwidth optical amplifier disposed between the first modulator and the first optical coupler to amplify the plurality of modulated optical signals sufficiently to record spectral content of the plurality of modulated optical signals in the material.

41. The apparatus of claim 25, the first optical coupler further comprising an acousto-optic deflector assembly to direct a frequency shifted optical signal based on an optical signal of the plurality of optical signals into a different spatial mode of the set of one or more spatial modes.

42. The apparatus of claim 25, further comprising a long-life, maintenance-free closed-cycle cryostat to condition the material.

43. The apparatus of claim 25, said detector further comprising a low-bandwidth, low-noise photo-receiver.

44. The apparatus of claim 26, said ADC further comprising a low-bandwidth, high-dynamic-range analog to digital converter.

45. The apparatus of claim 25, wherein the first optical coupler directs each different plurality of input signals from the signal set onto the material to integrate the spectral content of an interaction among each plurality into the interaction absorption spectrum before the interaction absorption spectrum decays.

46. The apparatus of claim 41, the acoustic-optic deflector assembly further comprising an AOD set of one or more acousto-optic deflectors (AODs) configured so that:

an optical output path from a first AOD of the AOD set is directed into an input of a second AOD of the AOD set; and an acoustic signal propagates in the second AOD in a direction opposite to a direction that an acoustic signal propagates in the first AOD.

47. The apparatus of claim 46, wherein the first AOD is different from the second AOD.

48. The apparatus of claim 46, wherein the first AOD is the same as the second AOD.

49. A system for processing high time-bandwidth-product (TBP) RADAR signals, comprising:

a optical analog processing device comprising:
  a signal input port for receiving a signal set of one or more pluralities of input signals;
  a material with an inhomogeneously broadened absorption spectrum including a plurality of homogeneously broadened absorption lines;
  a first optical coupler to direct a plurality of modulated optical signals based on each plurality of input signals in the signal set onto the material in a set of one or more spatial modes within about a phase coherence time of a homogeneously broadened absorption line to record an interaction absorption spectrum that represents spectral processing of the plurality of input signals;
a source of a probing signal; and
  a detector to measure, with time, based on the interaction absorption spectrum and the probing signal, a readout signal that represents a temporal map of the interaction absorption spectrum,
  wherein the readout signal includes frequency components that relate to a processing result of processing the first plurality of signals;

a RADAR signal conditioner configured for:
  selecting a first set of one or more signals based on one or more RADAR transmitted signals, and a second set of one or more signals based one or more received signals based on the one or more RADAR transmitted signals after reflection from a target; and
  sending the first set of signals and the second set of signals to the signal input port of the analog optical processing device; and a processor configured to determine range with high resolution to the target based on the readout signal.

50. The system of claim 49, said processor further configured to determine speed of the target based on a Doppler shift of the second set of signals relative to the first set of signals based on the readout signal.

51. A method of processing large bandwidth signals over long times, resulting in high time-bandwidth-product (TBP) signal processing, comprising the steps of:

causing an input signal on an optical carrier to interact in a material with an inhomogeneously broadened absorption spectrum including a plurality of homogeneously broadened absorption lines to record an interaction absorption spectrum; and within about a population recovery time for a population of optical absorbers in the material, reading the interaction absorption spectrum to produce a readout signal that represents a temporal map of the interaction absorption spectrum, wherein the readout signal indicates frequency components of the input signal.

* * * * *

UNITED STATES PATENT AND TRADEMARK OFFICE
CERTIFICATE OF CORRECTION

| | | |
|---|---|---|
| PATENT NO. | : 7,265,712 B2 | Page 1 of 1 |
| APPLICATION NO. | : 10/515089 | |
| DATED | : September 4, 2007 | |
| INVENTOR(S) | : Merkel et al. | |

It is certified that error appears in the above-identified patent and that said Letters Patent is hereby corrected as shown below:

In Claim 5, delete: ""'said step of reading absorption of the frequency claim 1,"

Signed and Sealed this

Eleventh Day of December, 2007

JON W. DUDAS
*Director of the United States Patent and Trademark Office*

UNITED STATES PATENT AND TRADEMARK OFFICE
CERTIFICATE OF CORRECTION

PATENT NO. : 7,265,712 B2
APPLICATION NO. : 10/515089
DATED : September 4, 2007
INVENTOR(S) : Merkel et al.

Page 1 of 1

It is certified that error appears in the above-identified patent and that said Letters Patent is hereby corrected as shown below:

Column 36, lines 57 and 58, delete: ""said step of reading absorption of the frequency claim 1,"

This certificate supersedes the Certificate of Correction issued December 11, 2007.

Signed and Sealed this

First Day of January, 2008

JON W. DUDAS
*Director of the United States Patent and Trademark Office*